United States Patent [19]

Iwahashi

[11] Patent Number: 4,503,518

[45] Date of Patent: Mar. 5, 1985

[54] SEMICONDUCTOR IC MEMORY

[75] Inventor: Hiroshi Iwahashi, Yokohama, Japan

[73] Assignee: Tokyo Shibaura Denki Kabushiki Kaisha, Kawasaki, Japan

[21] Appl. No.: 304,037

[22] Filed: Sep. 21, 1981

[30] Foreign Application Priority Data

Sep. 25, 1980 [JP] Japan .................. 55-133560

[51] Int. Cl.$^3$ .............................. G11C 11/40
[52] U.S. Cl. .................... 365/104; 365/210; 365/204
[58] Field of Search ............... 365/174, 200, 201, 205, 365/207, 210, 94, 104, 204

[56] References Cited

U.S. PATENT DOCUMENTS

| 4,094,008 | 6/1978 | Lockwood et al. | 365/210 X |
| 4,134,151 | 1/1979 | O'Connell et al. | 365/207 X |
| 4,192,014 | 3/1980 | Craycraft | 365/104 |
| 4,202,044 | 5/1980 | Beilstein, Jr. et al. | 365/182 |
| 4,301,518 | 11/1981 | Klaas | 365/207 X |

OTHER PUBLICATIONS

J. Eimbinder, Semiconductor Memories, Wiley-Interscience (1971), section 6.2, pp. 48–51.

Primary Examiner—Joseph A. Popek

Attorney, Agent, or Firm—Finnegan, Henderson, Farabow, Garrett & Dunner

[57] ABSTRACT

Disclosed is a semiconductor IC memory which has memory cells for storing given data; data lines coupled to the memory cells for transferring data stored in the memory cell; decoders having a sense point and coupled to the memory cells and data lines, for selecting one of the memory cells to couple the selected memory cell with the sense point, the potential of the data line coupled to the selected memory cell being changed with the stored data of selected memory cell; and a sense amplifier coupled to the sense point for sensing the stored data of selected memory cell and providing a read out data corresponding to the sensed stored data. Each of said memory cells has a predetermined threshold level which determines the sense point potential. The predetermined threshold level is selected from four fixed levels. The sense amplifier includes comparators coupled to the sense point for comparing the sense point potential with given comparison levels and providing a comparison result corresponding to the predetermined threshold level; and a selection logic coupled to the comparators and responsive to the logical state of comparison result, for providing an output corresponding to two bits of binary data stored in the selected memory cell and used as the read out data.

36 Claims, 47 Drawing Figures

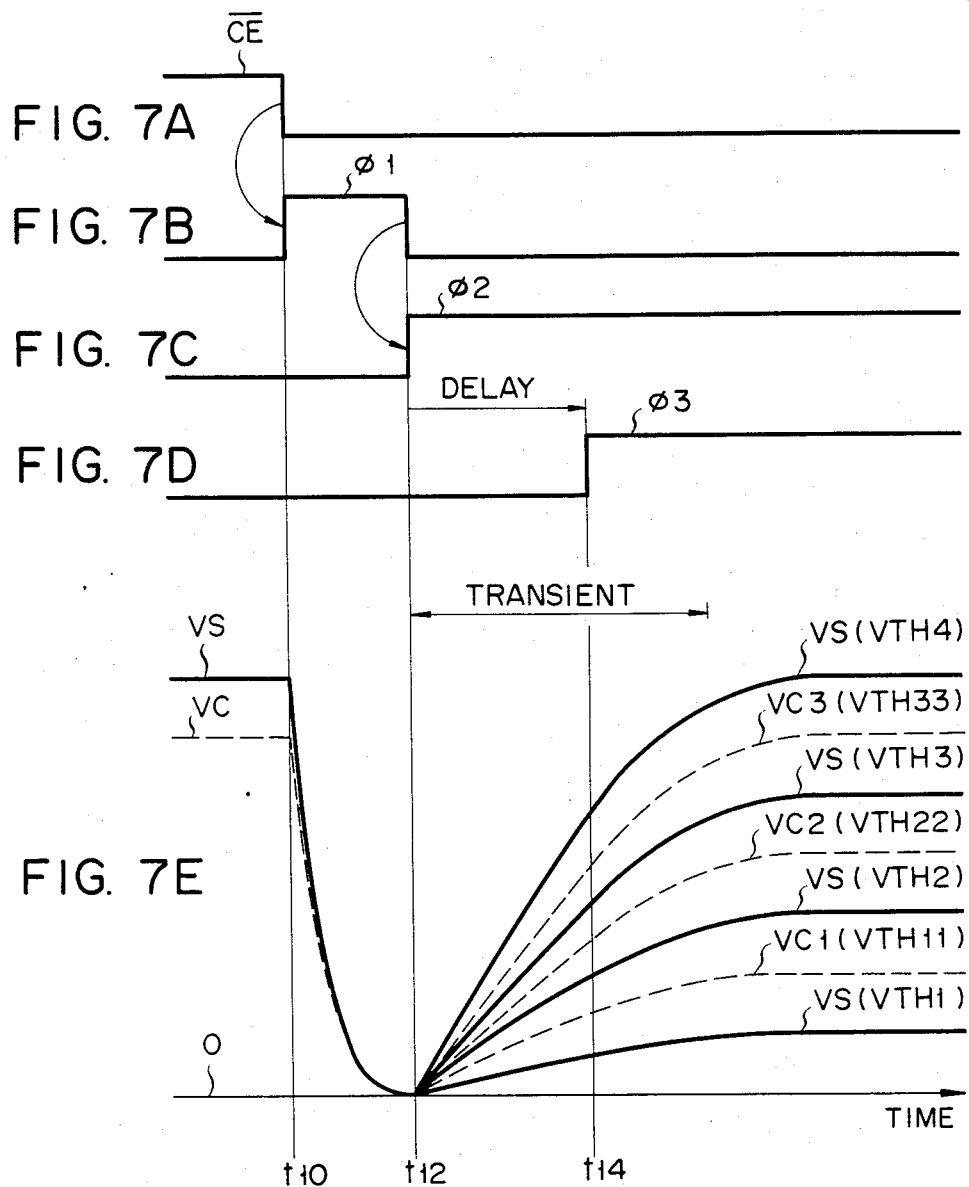

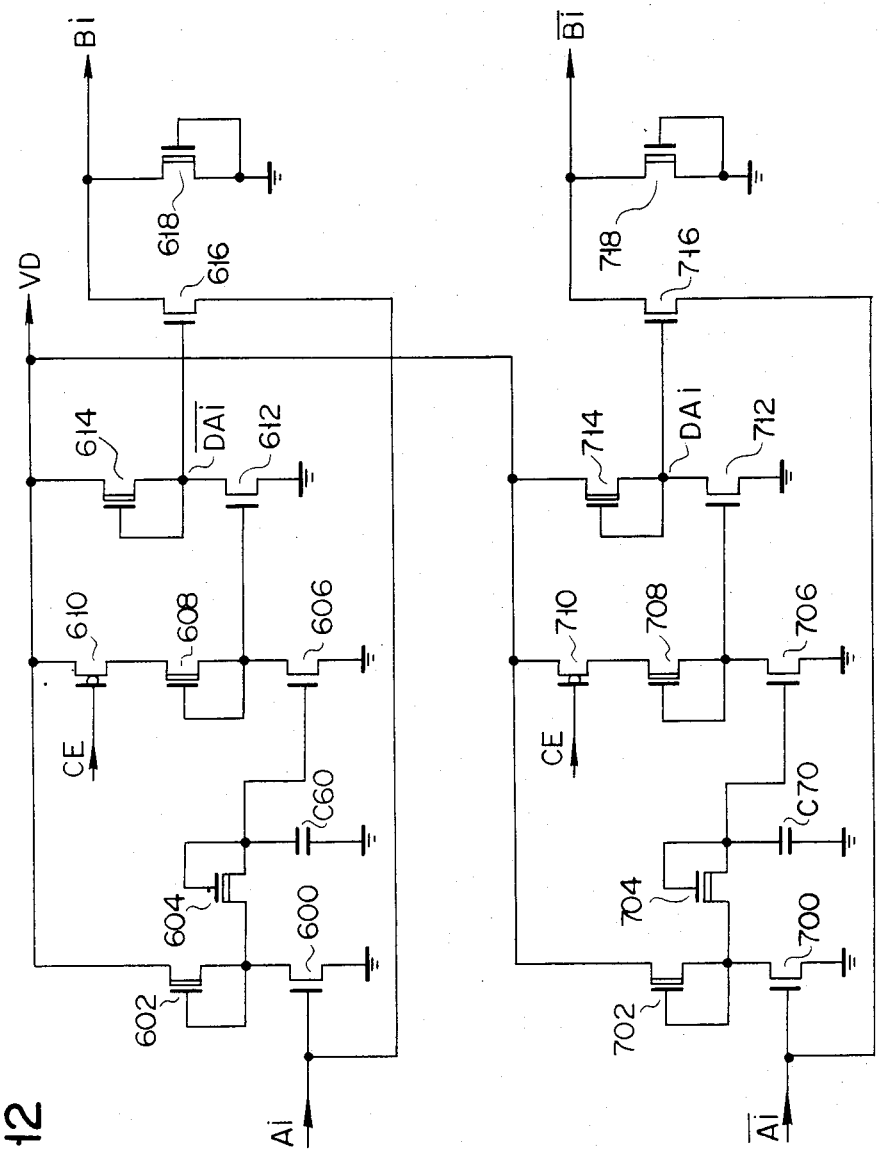
F I G. 12

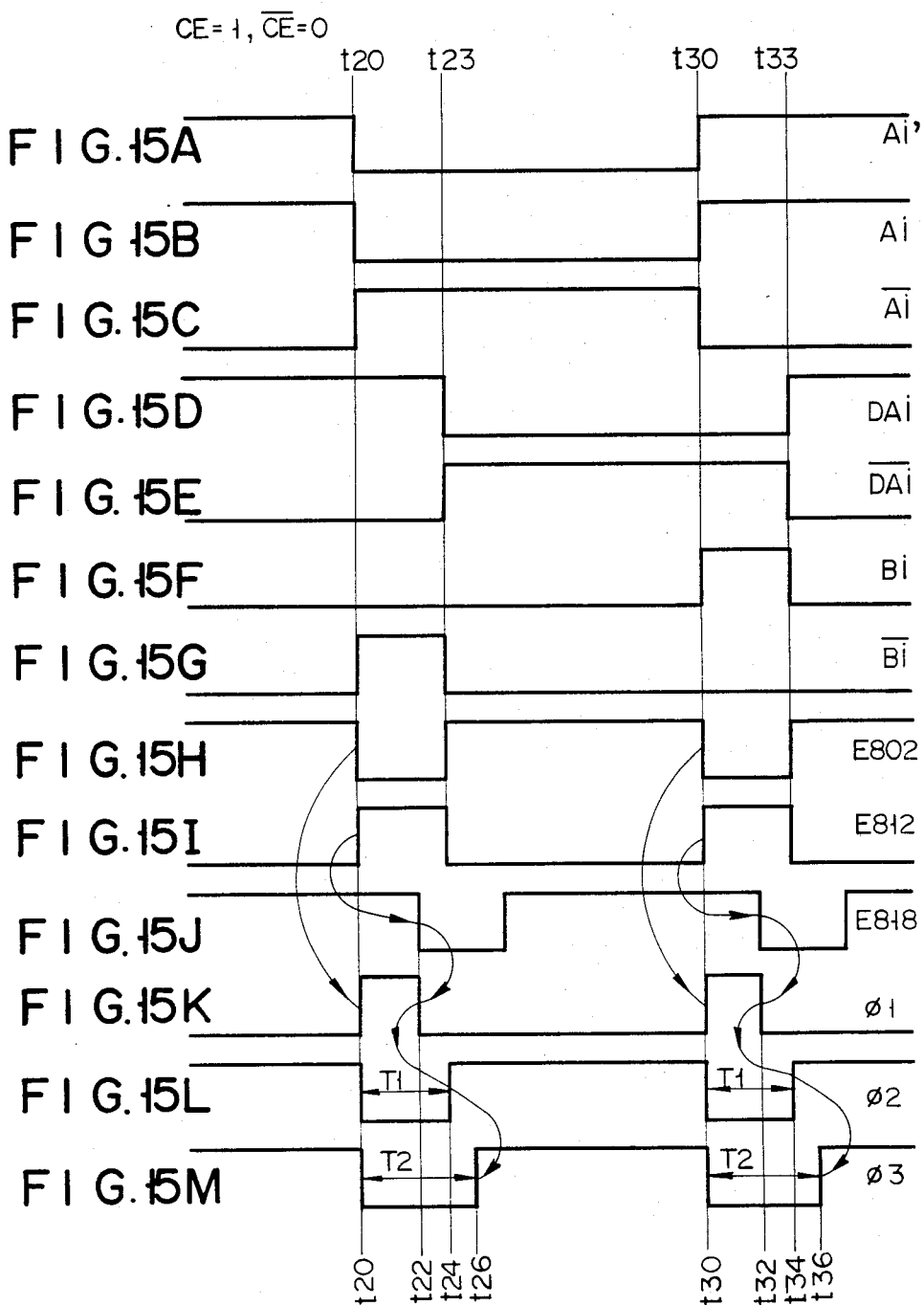

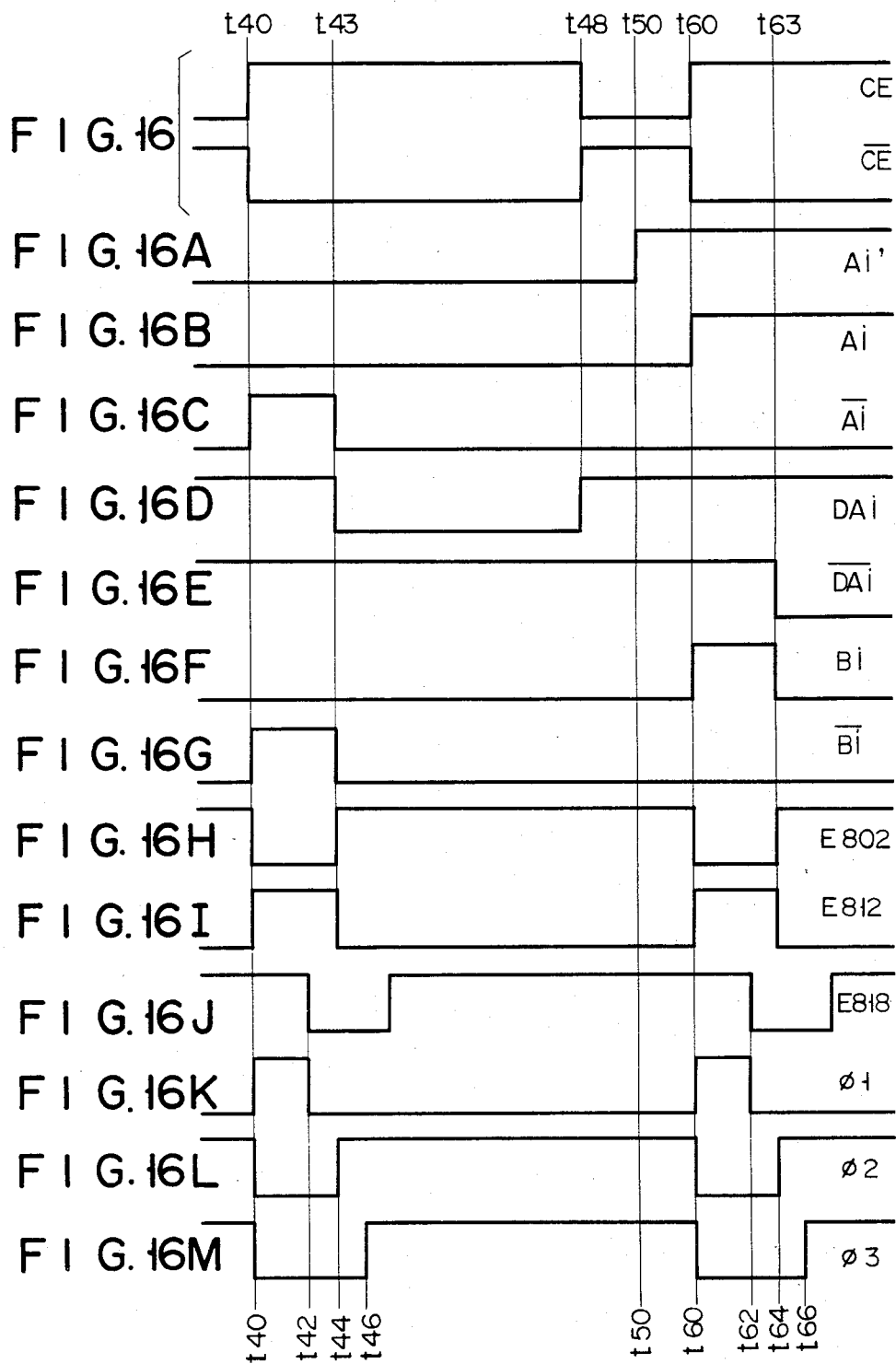

SEMICONDUCTOR IC MEMORY

BACKGROUND OF THE INVENTION

The present invention relates to a semiconductor IC ROM of small chip size.

A read-only memory (ROM) is generally formed of one transistor/one memory cell. Methods for storing data in such a ROM include the following:

(a) High and low levels of the gate threshold voltage of the cell transistor are made to correspond with the stored data. For example, logic 1 is assigned to the stored data of the cell transistor of high threshold level. Logic 0 is assigned to the stored data of the cell transistor of low threshold level.

(b) The stored data is discriminated according to whether or not the drain (or source) of the cell transistor is connected to a data line of the memory. For example, logic 0 is assigned to the stored data of the cell transistor connected to the data line, and logic 1 is assigned to the stored data of the cell transistor disconnected from the data line.

Readout of the data in method (a) above is performed in the manner to be described below. First, a drive voltage Va of a given potential is applied to a word line to which are connected the gates of the cell transistors which are assigned to logic 0 or 1. If the threshold voltage of the transistor of logic 1 is represented by VH, and if the threshold voltage of the transistor of logic 0 is represented by VL, the relation $VH > Va > VL$ holds. Therefore, the cell transistor of logic 1 is turned off and the cell transistor of logic 0 is turned on. By this on/off operation, the data lines to which these transistors are connected are charged or discharged. Then, based on the high or low data line potential corresponding to this charging or discharging, the stored data, logic 1 or logic 0, is read out.

Readout of the data in method (b) is performed in the manner to be described below. First, a drive voltage Vb of a given potential is applied to a word line. To this word line are connected the gates of cell transistors of logic 0 and cell transistors of logic 1. The gate threshold voltages of these cell transistors are all represented by VTH which satisfies the relation $Vb > VTH$. Therefore, all the cell transistors are turned on. A data line connected to one of these turned on cell transistors acquires a low potential. A data line which is connected to none of these turned on cell transistors acquires a high potential. Based on the high or low potential, the stored data, logic 1 or 0, is read out.

In either of methods (a) and (b) described above, only one-bit data (logic 1 or 0) can be stored in one memory cell. Therefore, when an attempt is made to increase the memory capacity with a prior art IC ROM, the IC chip size correspondingly increases. This is a main factor for the higher cost of IC memories.

SUMMARY OF THE INVENTION

The present invention has been made in consideration of this and has for its object to provide a semiconductor IC memory according to which an IC chip for providing a desired memory capacity may be made small.

In order to achieve this object, 2-bit data is stored in one memory cell in a semiconductor IC memory according to the present invention. More specifically, four different data line potentials are assigned in correspondence with the stored data of the memory cells. Two potentials among the four correspond to logic 1 or 0 as in the case of the prior art ROM. The remaining two potentials correspond to logics 1 and 0 for the 2-bit data. Desired 1-bit data can be obtained from the 2-bit data using a logic circuit operative according to the special address data. Since two different kinds of data (logic 1 and logic 0) may be stored in a single memory cell in this manner, the IC chip size may be made smaller than that with the prior art IC ROM.

BRIEF DESCRIPTION OF THE DRAWINGS

FIGS. 7A to 7D are timing charts showing the mode of operation of the blocks shown in FIG. 6A;

FIG. 7E is a graph showing changes in potentials VS and VC with respect to time in selected lines 16 and 130 shown in FIG. 6, where the gate threshold voltages VTH are used as parameters;

FIG. 12 shows a circuit which is used in combination with the circuit shown in FIG. 11 and which generates pulses Bi and $\overline{Bi}$ from the data Ai and $\overline{Ai}$;

FIGS. 15A to 15M are timing charts illustrating the mode of operation of the circuitry shown in FIGS. 11 to 14, where the manner according to which the pulses $\phi$ to $\phi 3$ are generated from the change in the address data Ai' is shown; and FIGS. 16 and 16A to 16M are timing charts for showing the mode of operation of the circuitry shown in FIGS. 11 to 14, where the manner according to which the pulses $\phi 1$ to $\phi 3$ are generated from the change in the chip enable signal CE (or $\overline{CE}$) is shown.

DETAILED DESCRIPTION OF THE PREFERRED EMBODIMENTS

Before proceeding with the description of the embodiments of the invention, it will expressly be understood that like reference symbols are used to designate like portions throughout the drawings for simplicity of illustration and that the components designated by like reference symbols may easily be replaced with each other or one another with minor change thereof by a skilled person in the art. An embodiment of a semiconductor IC memory according to the invention will be described.

Figure 1:
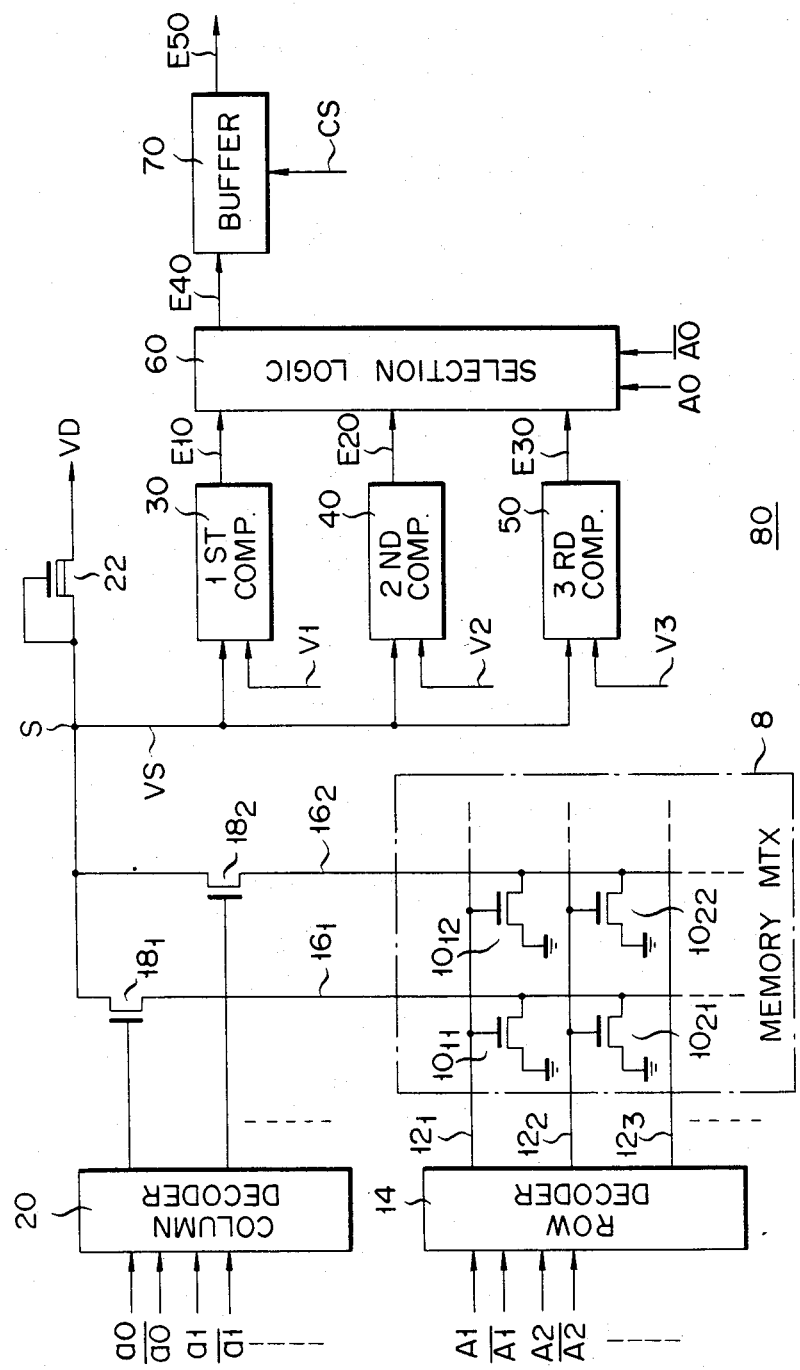
FIG. 1 is a block diagram showing the configuration of one embodiment of a semiconductor IC memory according to the present invention.

FIG. 1 shows one embodiment of the present invention. MOS transistors used herein are assumed to be all n-channel type. A memory matrix 8 includes a plurality of cell transistors $10ij$. The gates of the transistors $10ij$ are connected to word lines $12i$, the drains thereof are connected to data lines $16j$, and the sources thereof are grounded. Although these sources may be connected to a suitable negative supply voltage, they are generally connected to a circuit ground which is a 0-volt circuit. The gate threshold voltages of the cell transistors $10ij$ are set to be one of the levels VTH1 to VTH4 according to the stored contents. The respective word lines $12i$ of the memory matrix 8 are connected to a row decoder 14. The respective data lines $16j$ of the matrix 8 are connected to the sources of n-channel enhancement mode MOS type column gate transistors $18j$. The respective gates of the transistors $18j$ are connected to a column decoder 20. The drains of the transistors $18j$ are connected to a sense point S. The point S is connected to a positive supply voltage VD (e.g., +5 V) through a source-drain path of an n-channel depletion mode MOS type load transistor 22.

Least significant address data a0 and $\overline{a0}$ are input to the decoder 20 while address data A0 and $\overline{A0}$ corresponding to the data a0 and $\overline{a0}$ are not input to the decoder 14.

At the sense point S a sense potential VS corresponding to the gate threshold voltage VTH of a selected cell transistor $10ij$ appears. The cell transistors $10ij$ have gate threshold voltages VTH1, VTH2, VTH3 and VTH4. These gate threshold voltages hold the relation VTH1 < VTH2 < VTH3 < VTH4 and respectively correspond to specific stored data D1 and D2. The relationship between the stored data D1 and D2 and the gate threshold voltages VTH1 to VTH4 are shown in Table 1 below:

TABLE 1

| Gate threshold | Stored data | |
|---|---|---|
| voltage | D1 | D2 |
| VTH1 | 0 | 0 |
| VTH2 | 0 | 1 |
| VTH3 | 1 | 1 |
| VTH4 | 1 | 0 |

Since the sense potential VS varies according to the gate threshold voltage VTH of the selected cell transistor $10ij$ as will be described hereinafter, the stored data D1 and D2 may be detected from the level of the sense potential VS.

The sense voltage VS is applied to a first comparator 30, a second comparator 40, and a third comparator 50. To these comparators 30, 40 and 50 are respectively supplied with a first comparison level V1, a second comparison level V2, and a third comparison level V3. The first comparator 30 outputs a first comparison output E10 which becomes logic 1 if $VS \leq V1$ and which becomes logic 0 if $VS > V1$. The second comparator 40 outputs a second comparison output E20 which becomes logic 1 if $VS \leq V2$ and which becomes logic 0 if $VS > V2$. The third comparator 50 outputs a third comparison output E30 which becomes logic 1 if $VS \leq V3$ and which becomes logic 0 if $VS > V3$.

The comparison outputs E10, E20 and E30 are supplied to a selection logic 60. To the logic 60 are input address data A0 and $\overline{A0}$ corresponding to the least significant address data of the row decoder 14.

If $VS \leq V1$, the logic levels of (E10, E20, E30) are (1, 1, 1). In this case, regardless of the values of A0 and $\overline{A0}$, the logic 60 outputs a gated output E40 of logic 0. This represents a case wherein the stored data "logic 0" is read out from the cell transistor $10ij$ of the gate threshold voltage level VTH1.

If $V1 < VS \leq V2$, the logic levels of (E10, E20, E30) are (0, 1, 1). In this case, E40=0 if A0=1, and E40=1 if A0=0. This represents a case wherein the 2-bit data "logic 0" and "logic 1" are read out from the cell transistor $10ij$ of the gate threshold voltage VTH2.

If $V2 < VS \leq V3$, logic levels of (E10, E20, E30) are (0, 0, 1). In this case, E40=1 regardless of the values of A0 and $\overline{A0}$. This represents a case wherein the data "logic 1" is read out from the cell transistor $10ij$ of the gate threshold voltage VTH3.

If $V3 < VS$, the logic levels of (E10, E20, E30) are (0, 0, 0). In this case, E40=1 if A0=1, and E40=0 if A0=0. This represents a case wherein the 2-bit data "logic 1" and "logic 0" are read out from the cell transistor $10ij$ of the gate threshold voltage VTH4.

The gated output E40 is supplied to an output buffer 70. When a chip selection signal CS which is also supplied to the output buffer 70 is logic 1, the output E40 is read out as readout data E50.

The components 30 to 60 constitute a sense amplifier 80.

Figure 2:
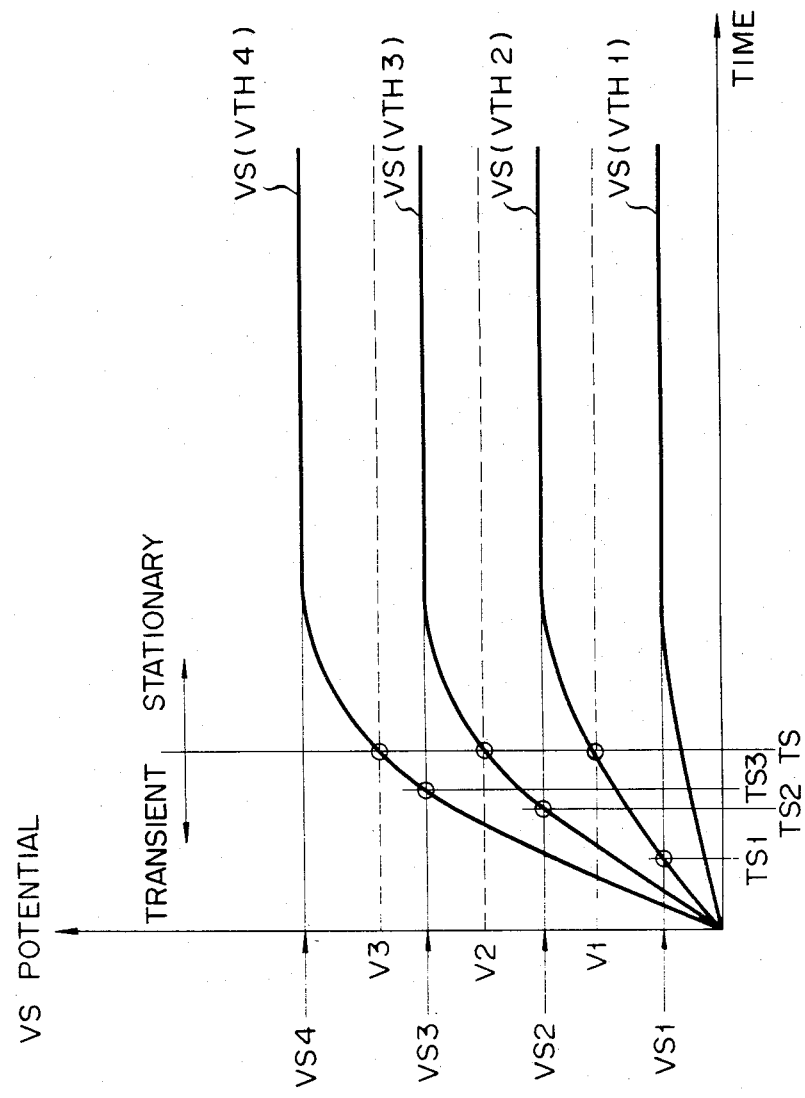
FIG. 2 is a graph showing changes in the sense potential with respect to time when one data line 16 shown in FIG. 1 is charged, where the threshold voltages VTH of cell transistors $10ij$ are used as parameters.

FIG. 2 shows the changes in the sense potential VS over time when the data line 16 is charged, taking the gate threshold voltage VTH of a selected cell transistor $10ij$ as a parameter. As may be apparent from FIG. 2, there are two sensing periods of the sense potential VS:

(i) a transient period (before TS; $dVS/dt \neq 0$)
 (ii) a stationary period (after TS; $dVS/dt \sim 0$)

The readout time may be shortened if the sense potential VS is sensed in the transient period. On the other hand, the memory device circuitry may be simplified if the sense potential VS is sensed in the stationary period.

Figure 3:
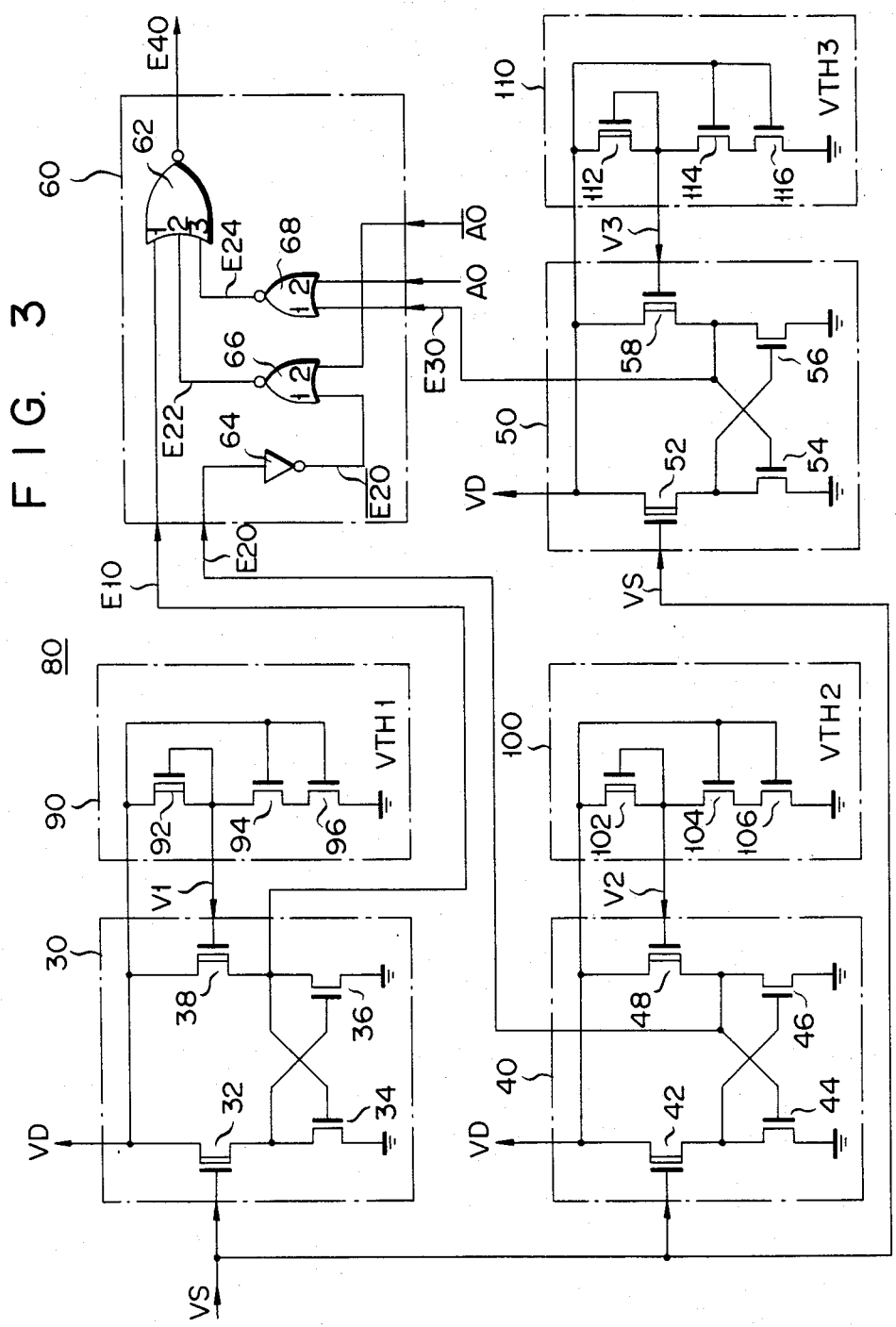
FIG. 3 is a circuit diagram of a sense amplifier 80 shown in FIG. 1.

FIG. 3 shows a circuit diagram of the sense amplifier 80 for sensing the sense potential VS in the stationary period. The sense potential VS is applied to the gate of a depletion mode MOS transistor 32. The source of the transistor 32 is connected to the drain and gate, respectively, of enhancement mode MOS transistors 34 and 36. The sources of the transistors 34 and 36 are grounded. The gate and drain of the transistors 34 and 36, respectively, are connected to the source of a depletion mode MOS transistor 38. The drains of the transistors 32 and 38 are connected to the positive supply voltage VD. The transistors 32 to 38 constitute the first comparator 30.

The gate of the transistor 38 is connected to the source and gate of a depletion mode MOS transistor 92. The drain of the transistor 92 is connected to the positive supply voltage VD, and the source thereof is connected to the drain of an enhancement mode MOS transistor 94. The source of the transistor 94 is grounded through the drain-source path of an enhancement mode MOS transistor 96. The gates of the transistors 94 and 96 are connected to the positive supply voltage VD. The transistor 92 is of the same size as that of the load transistor 22 (FIG. 1). The transistor 94 is of the same size as that of the gate transistor 18. The gate threshold voltage of the transistor 96 is set at VTH1. The transistors 92 to 96 constitute a voltage divider. The first comparison level V1 is obtained from the drain of the transistor 94. The transistors 92 to 96 constitute a first level source 90.

The sizes of the transistors 32 and 38 are set so that the comparator 30 outputs a first comparison output E10 which becomes logic 1 if VS≦V1 and which becomes logic 0 if VS>V1. The output E10 is obtained from the drain of the transistor 36.

The sense potential VS is input to the gate of a depletion mode MOS transistor 42. The source of the transistor 42 is connected to the drain and gate, respectively, of enhancement mode MOS transistors 44 and 46. The sources of the transistors 44 and 46 are grounded. The gate and drain of the transistors 44 and 46, respectively, are connected to the source of a depletion mode MOS transistor 48. The drains of the transistors 42 and 48 are connected to the positive supply voltage VD. The transistors 42 to 48 constitute the second comparator 40.

The gate of the transistor 48 is connected to the source and gate of a depletion mode MOS transistor 102. The drain of the transistor 102 is connected to the positive supply voltage VD, and the source thereof is connected to the drain of an enhancement mode MOS transistor 104. The source of the transistor 104 is grounded through the drain-source path of an enhancement mode MOS transistor 106. The gates of the transistors 104 and 106 are connected to the positive supply voltage VD. The transistor 102 is of the same size as that of the load transistor 22 (FIG. 1). The transistor 104 is of the same size as that of the gate transistor 18. The gate threshold voltage of the transistor 106 is set at VTH2. The transistors 102 to 106 constitute a voltage divider. The second comparison level V2 is obtained from the drain of the transistor 104. The transistors 102 to 106 constitute a second level source 100.

The sizes of the transistors 42 to 48 are set so that the comparator 40 outputs a second comparison output E20 which becomes logic 1 if VS≦V2 and which becomes logic 0 if VS>V2. The output E20 is obtained from the drain of the transistor 46.

The sense potential VS is input to the gate of a depletion mode MOS transistor 52. The source of the transistor 52 is connected to the drain and gate, respectively, of enhancement mode MOS transistors 54 and 56. The sources of the transistors 54 and 56 are grounded. The gate and drain of the transistors 54 and 56, respectively, are connected to the source of a depletion mode MOS transistor 58. The drains of the tranisistors 52 and 58 are connected to the positive supply voltage VD. The transistors 52 to 58 constitute the third comparator 50.

The gate of the transistor 58 is connected to the source and gate of a depletion mode MOS transistor 112. The drain of the transistor 112 is connected to the positive supply voltage VD, and the source thereof is connected to the drain of an enhancement mode MOS transistor 114. The source of the transistor 114 is grounded through the drain-source path of an enhancement mode MOS transistor 116. The gates of the transistors 114 and 116 are connected to the positive supply voltage VD. The transistor 112 is of the same size as that of the load transistor 22 (FIG. 1). The transistor 114 is of the same size as that of the gate transistor 18. The gate threshold voltage of the transistor 116 is set at VTH3. The transistors 112 to 116 constitute a voltage divider. The third comparison level V3 is obtained from the drain of the transistor 114. The transistors 112 to 116 constitute a third level source 110.

The sizes of the transistors 52 to 58 are set so that the comparator 50 outputs a third comparison output E30 which becomes logic 1 if VS≦V3 and which becomes logic 0 if VS>V3. The output E30 is obtained from the drain of the transistor 56.

The output E10 is input to a first input of a NOR gate 62. The output E20 is converted to an inverted output $\overline{E20}$ through an inverter 64. The output $\overline{E20}$ is input to a first input of a NOR gate 66. The address data $\overline{A0}$ is input to a second input of the gate 66. A NORed output E22 of the gate 66 is input to a second input of the gate 62. The output E30 is input to a first input of a NOR gate 68. The address data A0 is input to a second input of the gate 68. A NORed output E24 of the gate 68 is input to a third input of the gate 62. The gate 62 produces a gated output E40 from a logical NOR of the outputs E10, E22 and E24. The components 62 to 68 constitute the selection logic 60.

The sense amplifier 80 shown in FIG. 3 operates in the manner to be described below. For the sake of simplicity, the mode of operation of the sense amplifier 80 at a time TS of FIG. 2 will be described. According to the gate threshold voltage VTH of a selected cell transistor 10$ij$ selected by address data Ai and ai, the output E40 or the readout data E50 takes the following values:

(i) If VTH=VTH1:

Since VS≦V1<V2<V3 (FIG. 2), E10=1, E20=1, and E30=1. In this case, since E10=1, E40=0 irrespective of A0 and $\overline{A0}$.

(ii) If VTH=VTH2:

Since V1<VS≦V2<V3 (FIG. 2), E10=0, E20=1, and E30=1. In this case, $\overline{E20}$=0 since E20=1, and E24=0 since E30=1. Since E10=0 and E24=0, the logic level of E40 depends upon the logic level of E22. Since $\overline{E20}$=0, the logic level of E22 is determined by $\overline{A0}$. Thus, E22=1 and E40=0 when $\overline{A0}$=0, and E22=0 and E40=1 when $\overline{A0}$=1. In this manner, the 2-bit data (corresponding to data of two addresses) is stored in the cell transistor 10$ij$ wherein VTH=VTH2.

(iii) If VTH=VTH3:

Since V1<V2<VS≦V3 (FIG. 2), E10=0, E20=0, and E30=1. In this case, $\overline{E20}$=1 and E22=0 since E20=0, and E24=0 since E30=1. Then, since E10=E22=E24=0, E40=1 irrespective of A0, $\overline{A0}$.

(iv) If VTH=VTH4:

Since V1<V2<V3<VS (FIG. 2), E10=0, E20=0, and E30=0. In this case, $\overline{E20}$=1 and E22=0 since E20=0. Since E10=E22=0, the logic level of E40 depends upon the logic level of E24. Since E30=0, the logic level of E24 depends upon the logic level of A0. Therefore, E24=1 and E40=0 when A0=0, and E24=0 and E40=1 when A0=1. In this manner, the 2-bit data is stored in the cell transistor 10$ij$ wherein VTH=VTH4, as in the case of the cell transistor 10$ij$ wherein VTH=VTH2.

In FIG. 2, the comparison levels V1, V2 and V3 are shown to be higher than the stationary levels VS1, VS2 and VS3 of the sense potential VS, respectively. However, this has been done for the sake of simplicity. As has been described earlier, if the gate threshold voltages of the transistors 96, 106 and 116 are equal to VTH1, VTH2 and VTH3, V1=VS1, V2=VS2, and V3=VS3. Therefore, the actual data readout will be performed before the time TS (from TS1 to TS3 in FIG. 2). Then, although the sensing of the stored data is performed in the transient period, it will be broadly considered that the circuitry in FIG. 3 performs the sensing in the stationary period as contrasted with the embodiment shown in FIG. 6.

In order to put the level V1 somewhere between VS1 and VS2, the level V2 somewhere between VS2 and VS3 and the level V3 somewhere between VS3 and VS4 as shown in FIG. 2, it is sufficient to provide the transistors 92, 102 and 112 with a conduction resistance lower than that of the transistor 22 shown in FIG. 1. More specifically, if the transistors 92, 102 and 112 have the same channel length as the transistor 22, it is sufficient to design the transistors 92, 102 and 112 to have a channel width larger than that of the transistor 22. In this case, it is desired that in the comparators 30, 40 and 50 the transistors 32 and 38 have the same size, so do the transistors 42 and 48, so do the transistors 52 and 58, so do the transistors 34 and 36, so do the transistors 44 and 46, and so do the transistors 54 and 56. As mentioned above, in the circuit of FIG. 3 the transistors 32 to 38 of the comparator 30, for example, have such sizes that the output E10 has logic "1" level when VS and V1 are of the same potential level.

Figure 4:
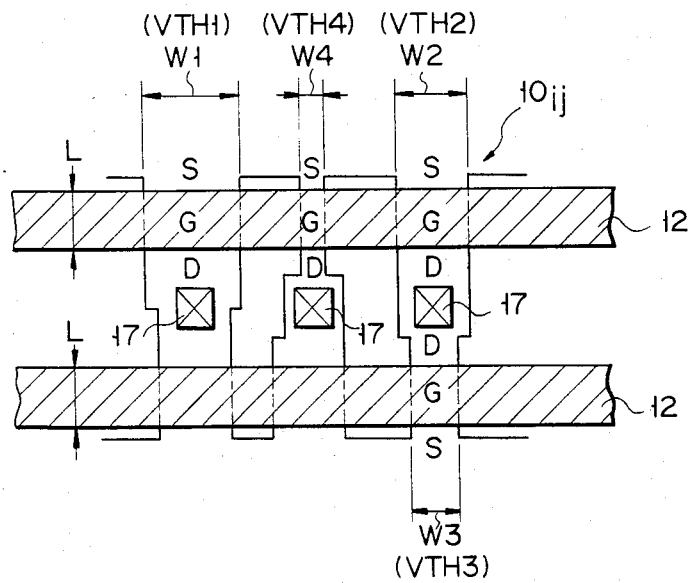
FIG. 4 shows an example of the IC pattern of the cell transistors $10ij$ shown in FIG. 1.

FIG. 4 shows an example of the IC pattern of the cell transistors 10$ij$. In the example of the IC pattern shown in FIG. 4, MOS transistors 10$ij$ with different channel widths W are formed below word lines 12 of a constant width L. The width L of the word line 12 corresponds to a channel length L of the transistors 10$ij$. The current feeding capacity of the transistor 10$ij$ is increased as the widening of width W with the fixed length L. In other words, if the length L is constant, the gate threshold voltage VTH would become smaller as the channel width W becomes wider. Channel widths W1 to W4 (W4 may be zero) respectively correspond to VTH1 to VTH4. The sources of the cell transistors 10$ij$ are connected to a circuit ground, and the drains thereof are connected to data lines (not shown) through contact holes 17.

Figure 5:
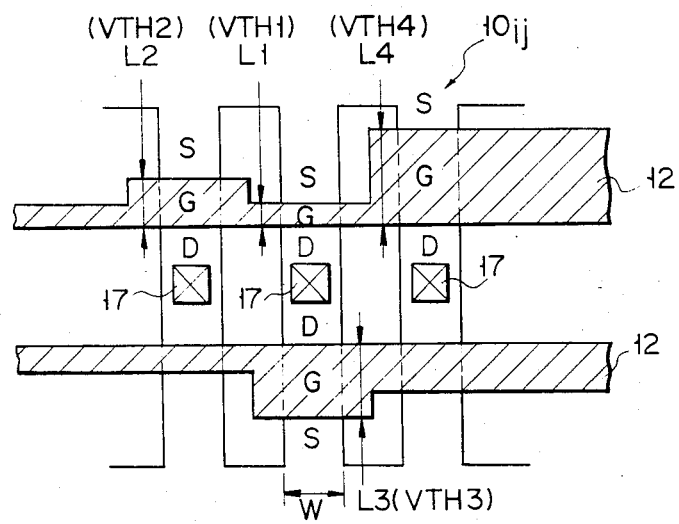
FIG. 5 shows an IC pattern of the semiconductor IC memory, as a preferred modification of that shown in FIG. 4.

FIG. 5 shows a modification of FIG. 4. According to this modified IC pattern, the MOS cell transistors 10$ji$ of the constant channel width W are formed below word lines 12 with different widths L. The smaller the channel-length L is, the more current can flow through the transistor, provided the width W remains unchanged. Thus, if the channel width W is constant, the gate threshold voltage VTH of the transistor 10$ij$ become smaller as the channel length L becomes smaller. Channel lengths L1 to L4, respectively, correspond to VTH1 to VTH4. The word lines 12 may be formed from poly-crystalline silicon.

In the IC pattern shown in FIG. 5, after forming the regions of source, drain and gate of cell transistors 10$ij$, the stored data may be determined by the pattern mask design of the polysilicon word lines 12. Thus, pattern masks other than that for the word lines 12 can be independent of the stored data. Therefore, the data may be stored in the ROM quickly and easily. This is because the source, drain and gate regions are formed at a stage of manufacture much earlier than the step of forming the polysilicon pattern, and hence the manufacture can proceed to the step immediately before the forming of the polysilicon pattern. For this reason, if a manufacturer receives an order for particular ROMs, he can deliver them in a short period of time.

If four threshold voltages are to be provided for the transistor without using the above polysilicon process, the step for determining a threshold voltage (e.g. ion implantation) has to be carried out four times. However, such additional steps are unnecessary if polysilicon is used to alter the pattern size of the line 12. Furthermore, since the channel width W is constant, or the channel width need not be made greater, the junction capacitance of data lines 16 may be made smaller and the resistance of the word lines 12 may also be made smaller. According to the configuration shown in FIG. 5, a ROM of faster readout speed can be obtained than with the configuration shown in FIG. 4.

The IC patterns shown in FIGS. 4 and 5 may be used in combination. For this purpose, both the channel width W and the channel length L are varied to obtain a desired threshold voltage VTH.

The transistors 96, 106 and 116 shown in FIG. 3 may be obtained in the same manner as in the case of the cell transistors 10$ij$.

Figure 6:
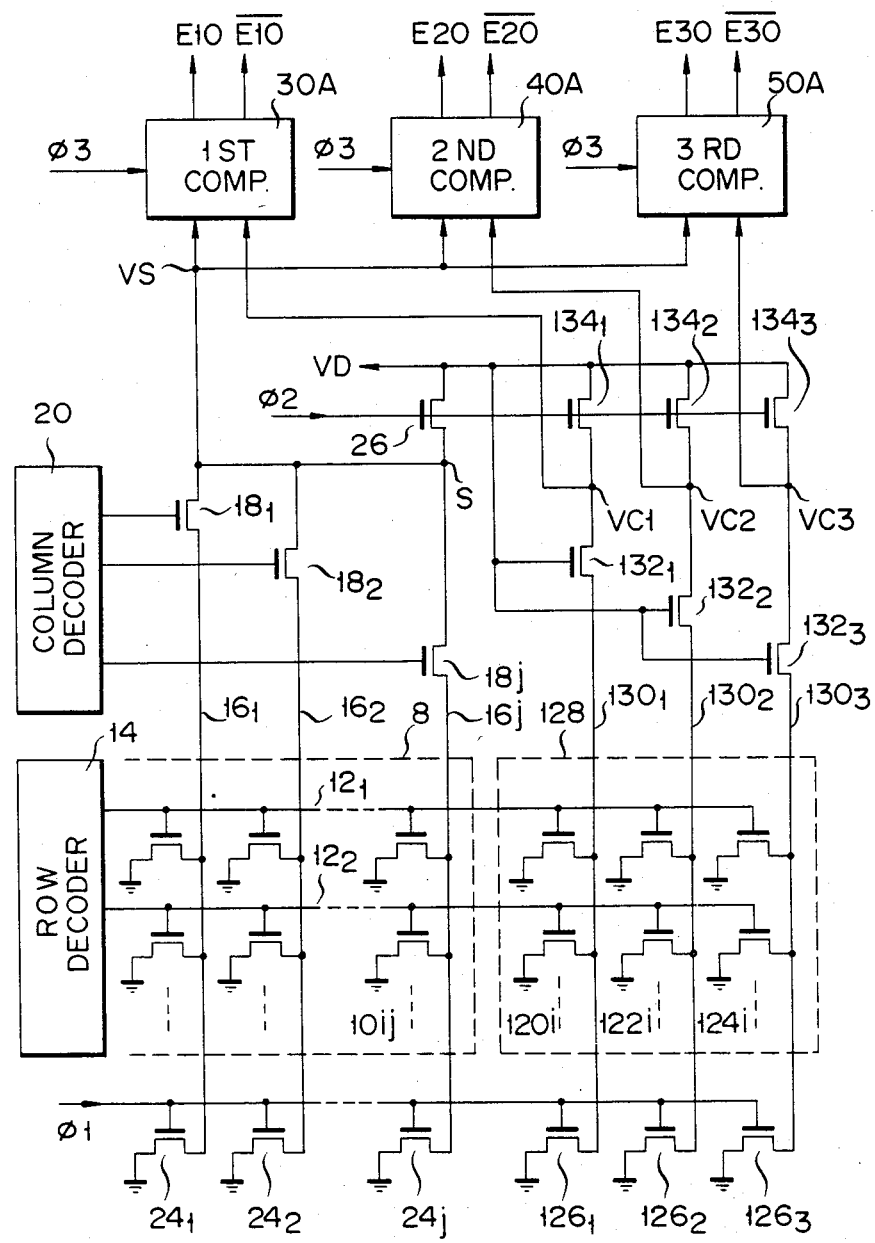
FIG. 6 is a circuit diagram showing the configuration of another embodiment of the semiconductor IC memory according to the present invention.

FIG. 6 shows another embodiment of the present invention. The MOS transistors used in this embodiment are all assumed to be of n-channel type. In the embodiment shown in FIG. 6, the sense potential VS is sensed in the transient period (FIG. 2).

The gates of dummy cell transistors 120$i$, 122$i$ and 124$i$ are connected to the word lines 12$i$. The sources of the transistors 120$i$, 122$i$ and 124$i$ are grounded. The transistors 120$i$, 122$i$ and 124$i$ constitute a dummy cell array 128. The drains of the transistors 120$i$ are connected to a dummy data line 130$_1$. The drains of the transistor 122$i$ are connected to a dummy data line 130$_2$. The drain of the transistors 124$i$ are connected to a dummy data line 130$_3$. The data lines 16$j$ are grounded through the drain-source paths of respective discharge transistors 24$j$. The dummy data lines 130$_1$, 130$_2$ and 130$_3$ are grounded through the drain-source paths of discharge transistors 126$_1$, 126$_2$ and 126$_3$. A discharge pulse $\phi$1 is supplied to the gates of the transistors 24$j$ and 126$_1$ to 126$_3$.

A gate threshold voltage VTH11 of the transistors 120$i$ is set so that the relation VTH1<VTH11<VTH2 is satisfied. If the transistors 10$ij$ have the configuration as shown in FIG. 5, channel length L11 of the transistor 120$i$ is set so that the relation L1<L11<L2 holds. Similarly, gate threshold voltages VTH22 and VTH33 of the transistors 122$i$ and 124$i$ are set so that the relations VTH2<VTH22<VTH3 and VTH3<VTH33<VTH4 hold, respectively. This may be realized by setting channel lengths L22 and L33 of the transistors 122$i$ and 124$i$ so that the relations L2<L22<L3 and L3<L33<L4 hold, respectively. Alternatively, the equivalent inner resistances of the transistors 134$_1$ to 134$_3$ may be made lower than that of the transistor 26. In this case, VTH1, VTH2 and VTH3 may be made equal to VTH11, VTH22 and VTH33, respectively.

The data lines 16$j$ are connected to the sense point S through gate transistors 18$j$. The sense point S is connected to the positive supply voltage VD through the source-drain path of an enhancement mode MOS transistor 26. The lines 130$_1$ to 130$_3$ are connected to the sources of enhancement mode MOS transistors 132$_1$ to 132$_3$. The transistors 132$_1$ to 132$_3$ are the same size as the transistors 18$j$. The drains of the transistors 132$_1$ to 132$_3$ are connected to the sources of enhancement mode MOS transistors 134$_1$ to 134$_3$. The drains of the transistors $134_1$ to $134_3$ and the gates of the transistors $132_1$ to $132_3$ are connected to the positive supply voltage VD. A charge pulse $\phi 2$ is supplied to the gates of the transistors 26 and $134_1$ to $134_3$.

The sense potential VS is input to a first comparator 30A, a second comparator 40A, and a third comparator 50A. A first comparison signal VC1 obtained at the source of the transistor $134_1$ is input to the first comparator 30A. A second comparison signal VC2 obtained at the source of the transistor $134_2$ is input to the second comparator 40A. A third comparison single VC3 obtained at the source of the transistor $134_3$ is input to the third comparator 50A. A timing pulse $\phi 3$ is supplied to the comparators 30A, 40A and 50A. In response to the pulse $\phi 3$, the comparators 30A, 40A and 50A compare the signals VC1, VC2, and VC3 with the sense potential VS and generate comparison outputs E10, $\overline{E10}$; E20, $\overline{E20}$; and E30, $\overline{E30}$, respectively.

Figure 6A:
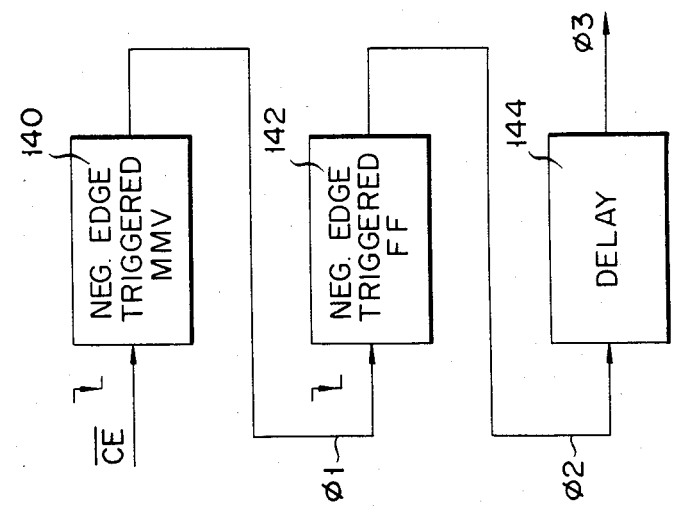
FIG. 6A is a block diagram of a circuit which is used in combination with the circuit shown in FIG. 6 and which generates pulses $\phi 1$ to $\phi 3$ from a chip enable signal $\overline{CE}$.

FIG. 6A shows a circuitry which generates pulses $\phi 1$ to $\phi 3$ in synchronism with a chip enable signal $\overline{CE}$. FIGS. 7A to 7D show the operation timing of the circuitry shown in FIG. 6A. The chip enable signal $\overline{CE}$ designates whether to enable or disable the entirety of the memory IC chip including the circuitry shown in FIG. 6. When $\overline{CE}=0$, the memory IC chip is enabled. The signal $\overline{CE}$ is supplied to a negative edge triggered type monostable multivibrator (MMV) 140. In response to the trailing edge (t10 in FIG. 7A) of the signal $\overline{CE}$, the MMV 140 is triggered to generate the pulse $\phi 1$ for a predetermined time interval (t10 to t12 in FIG. 7B). The pulse $\phi 1$ is input to a negative edge triggered type bistable multivibrator or flip-flop (FF) 142. In response to the trailing edge (t12 in FIG. 7B) of the pulse $\phi 1$, the FF 142 generates the pulse $\phi 2$ (t12 in FIG. 7C). The pulse $\phi 2$ is delayed for a certain time interval by a delay circuit 144 to become the pulse $\phi 3$ (t12 to t14 in FIG. 7D).

The circuitry shown in FIG. 6 operates in the manner to be described below. For reading out data from the memory shown in FIG. 6, $\overline{CE}=0$ (FIG. 7A). Then, the pulse $\phi 1$ becomes logic 1 (FIG. 7B) and the transistors 24j are turned on since the pulse $\phi = 1$. Then, the data lines 16j are discharged so that VS=0 (t10 to T12 in FIG. 7E). Since the pulse $\phi 1 = 1$, the transistors $126_1$ to $126_3$ are also turned on. Then, the dummy lines $130_1$ to $130_3$ also discharged and VC1 to VC3 become 0 level (t10 to t12 in FIG. 7E). The time interval (t10 to t12) is the period during which the lines 16j and $130_1$ to $130_3$ are completely discharged, and it is preferably short. When the time interval (t10 to t12) is long, the readout time from readout start (t10) to readout completed (t14) also becomes long. When the pulse $\phi 1$ becomes logic 0, the pulse $\phi 2=1$ (FIGS. 7B and 7C). Therefore, since the pulse $\phi 1 = 0$, the transistors 24j and $126_1$ to $126_3$ are turned off. Simultaneously, since the pulse $\phi 2=1$, the transistors 26 and $134_1$ to $134_3$ are turned on. Then, the data line 16 selected by the decoder 20 and the dummy lines $130_1$ to $130_3$ begin to be charged (t12 in FIG. 7E). When the pulse $\phi 3 = 1$ (t14 in FIG. 7D) after the charging of the lines 16 and 130 has begun, the comparators 30A, 40A and 50A compare the inputs thereto. This comparison is performed at a time t14 during the period of charging of the lines 16 and 130. This is the most important factor in FIG. 6.

It is now assumed that the gate threshold voltage VTH of the selected cell transistor 10ij is equal to VTH1; then VS<VC1<VC2<VC3 at the time t14. In this case, the logic levels of (E10, E20, E30) are (1, 1, 1), so that the 2-bit stored data "logic 0" and "logic 0" is read out.

When the gate threshold voltage VTH of the selected cell transistor 10ij is equal to VTH2, VC1<VS<VC2<VC3. In this case, the logic levels of (E10, E20, E30) become (0, 1, 1). Thus, the 2-bit data "logic 0" and "logic 1" discriminated according to the address data A0 are read out.

When the gate threshold voltage VTH of the selected cell transistor 10ij is equal to VTH3, VC1<VC2<VS<VC3. In this case, the logic levels of (E10, E20, E30) become (0, 0, 1), so that the 2-bit stored data "logic 1" and "logic 1" is read out.

When the gate threshold voltage VTH of the selected cell transistor 10ij is equal to VTH4, VC1<VC2<VC3<VS. In this case, the logic levels of (E10, E20, E30) become (0, 0, 0). Then, the 2-bit data "logic 1" and "logic 0" discriminated according to the address data A0 are read out.

The readout time of the stored data may be shortened as the delay time (t12 to t14) of the delay circuit 144 in FIG. 6A is shortened. However, the shorter the delay time, the smaller the level difference between VS and VC1 to VC3, so that data sensing by the comparators 30A, 40A and 50A becomes more difficult. Therefore, it is preferable to shorten the delay time (t12 to t14) only to the extent that the level comparison operation of the comparators 30A, 40A and 50A can be performed with reliability. In this manner, the readout speed may be made higher with this feature than with the circuitry shown in FIG. 3.

Figure 8:
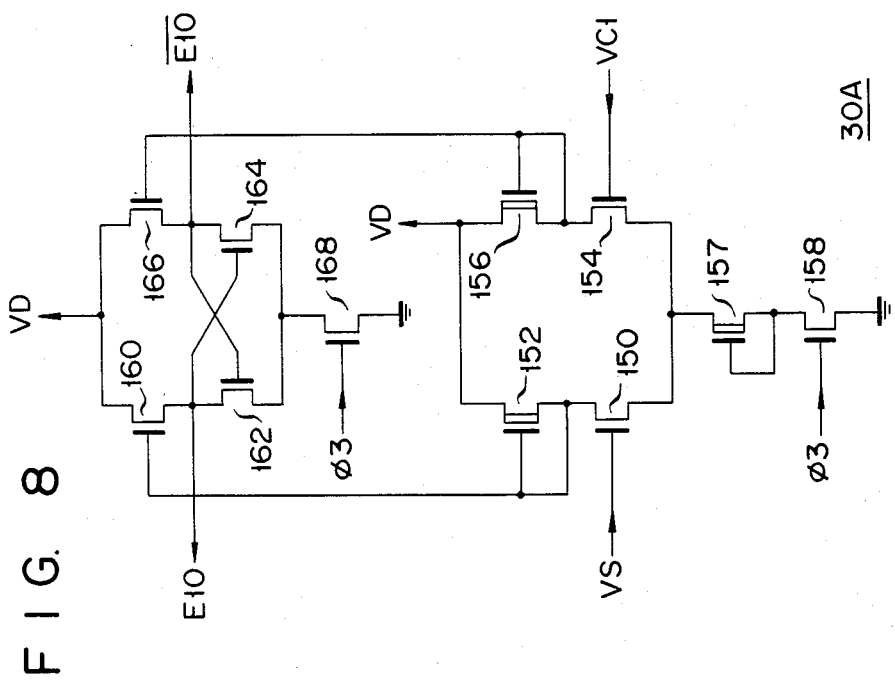
FIG. 8 is a block diagram of a comparator 30A shown in FIG. 6.

FIG. 8 shows an example of the circuit configuration of the comparator 30A shown in FIG. 6. The comparators 40A and 50A may have the same circuit configuration as the comparator 30A. The sense potential VS is applied to the gate of an enhancement mode MOS transistor 150. The drain of the transistor 150 is connected to the gate and source of a depletion mode MOS transistor 152, and the source thereof is connected to the source of an enhancement mode MOS transistor 154. The first comparison signal VC1 is supplied to the gate of the transistor 154. The drain of the transistor 154 is connected to the gate and source of a depletion mode MOS transistor 156. The drains of the transistors 152 and 156 are connected to the positive supply voltage VD. The source of the transistors 150 and 154 are connected to the drain of a depletion mode MOS transistor 157. The gate and source of the transistor 157 are grounded through the drain-source path of an enhancement mode MOS transistor 158. The timing pulse $\phi 3$ is input to the gate of the transistor 158.

The drain of the transistor 150 is connected to the gate of an enhancement mode MOS transistor 160. The source of the transistor 160 is connected to the drain and gate, respectively, of enhancement mode MOS transistors 162 and 164. The gate and drain of the transistors 162 and 164, respectively, are connected to the source of an enhancement MOS transistor 166. The drains of the transistors 160 and 166 are connected to the positive supply voltage VD. The sources of the transistors 162 and 164 are grounded through the drain-source path of an enhancement mode MOS transistor 168. The timing pulse $\phi 3$ is input to the gate of the transistor 168. The first comparison output E10 is output from the drain of the transistor 162. Derived from the drain of the transistor 164 is the output $\overline{E10}$ which is the inverted signal of the output E10. The transistors 150 and 154 may be a depletion mode.

Outputs E20, $\overline{E20}$ and E30, $\overline{E30}$ are obtained by the comparators 40A and 50A of the same configuration as shown in FIG. 8.

In the comparator 30A shown in FIG. 8, E10=$\overline{E10}$=1 when the pulse $\phi3$=0. If VS<VC1 when $\phi3$=1, E10=1 and $\overline{E10}$=0. On the other hand, if VS>VC1, E10=0 and $\overline{E10}$=1. Similarly, in the comparator 40A of the same configuration as shown in FIG. 8, if VS<VC2 when $\phi3$=1, E20=1 and $\overline{E20}$=0. On the other hand, if VS>VC2, E20=0 and $\overline{E20}$=1. Similarly, in the comparator 50A, if VS<VC3 when $\phi3$=1, E30=1 and $\overline{E30}$=0. On the other hand, if VS>VC3, E30=0 and $\overline{E30}$=1.

Figure 9:
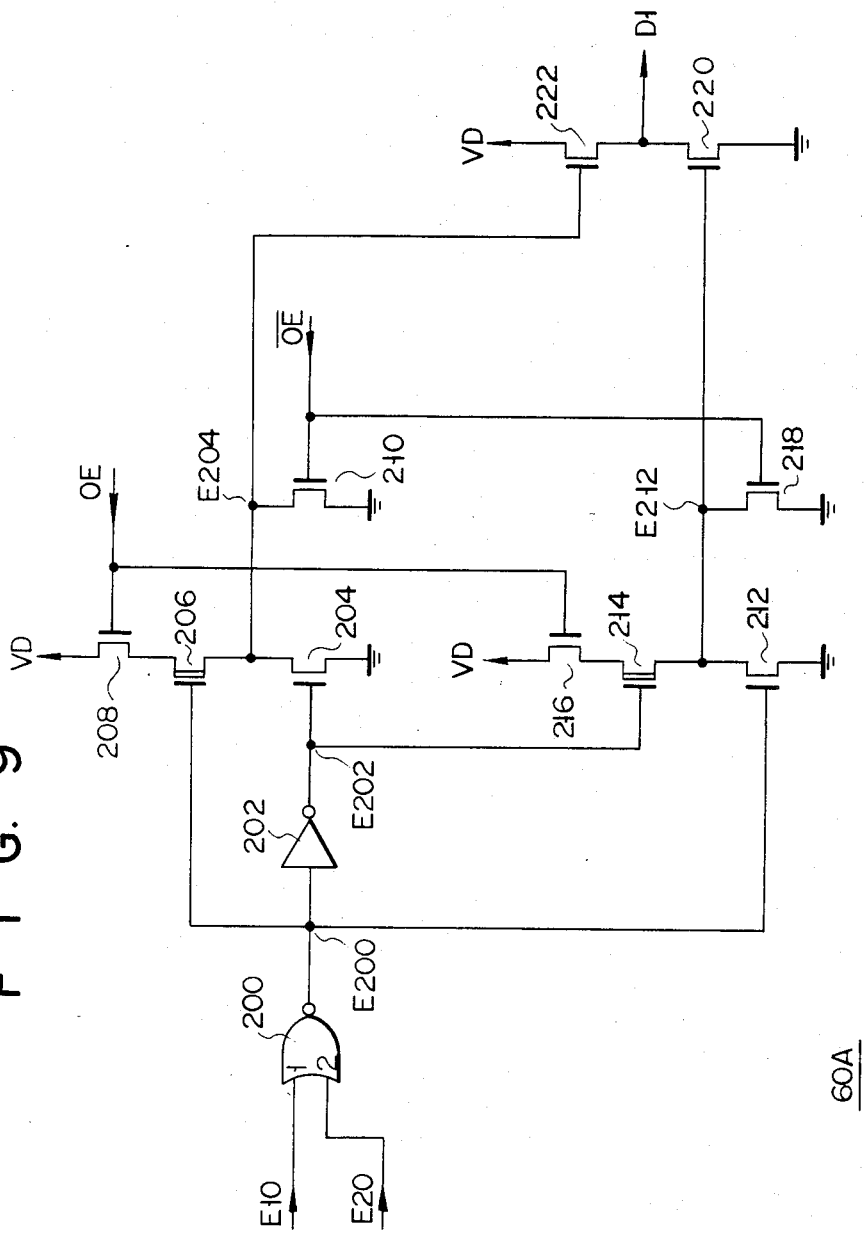
FIGS. 9 and 10 are circuit diagrams of logic circuits which are used in combination with the circuit shown in FIG. 6 and which retrieve predetermined stored data D1 and D2 from outputs of comparators 30A to 50A.

FIG. 9 shows an output buffer or a first selection logic 60A which synthesizes the first stored data D1 (Table 1) from the outputs E10 and E20 of the comparators 30A and 40A. It is understood that when there are two readout data lines D1 and D2 for indicating the logic states of the 2-bit data stored in the cell 10$ij$, readout selection by address signals A0 and $\overline{A0}$ is not needed. The outputs E10 and E20 are input to first and second inputs of a NOR gate 200. A NORed output E200 of the gate 200 is inverted to an inverted output E202 by an inverter 202. The output E202 is supplied to the gate of an enhancement mode MOS transistor 204. The source of the transistor 204 is grounded, and the drain thereof is connected to the source of a depletion mode MOS transistor 206. The output E200 is input to the gate of the transistor 206. The drain of the transistor 206 is connected to the positive supply voltage VD through the source-drain path of an enhancement mode MOS transistor 208. An output enable signal OE is input to the gate of the transistor 208. The drain of the transistor 204 is grounded through the drain-source path of an enhancement mode MOS transistor 210. An inverted output enable signal $\overline{OE}$ is input to the gate of the transistor 210. The levels of the signals OE and $\overline{OE}$ become OE=1 and $\overline{OE}$=0 when enabling the logic 60A.

The output E200 is also supplied to the gate of an enhancement mode MOS transistor 212. The source of the transistor 212 is grounded, and the drain thereof is connected to the source of a depletion mode MOS transistor 214. The output E202 is input to the gate of the transistor 214. The drain of the transistor 214 is connected to the positive supply voltage VD through the source-drain path of an enhancement mode MOS transistor 216. The signal OE is input to the gate of the transistor 216. The drain of the transistor 212 is grounded through the drain-source path of an enhancement mode MOS transistor 218. The signal $\overline{OE}$ is input to the gate of the transistor 218.

An output E212 obtained from the drain of the transistor 212 is connected to the gate of an enhancement mode MOS transistor 220. The source of the transistor 220 is grounded, and the drain thereof is connected to the positive supply voltage VD through the source-drain path of an enhancement mode MOS transistor 222. An output E204 obtained at the drain of the transistor 204 is input to the gate of the transistor 222. The first stored data D1 is obtained from the drain of the transistor 220.

Figure 10:
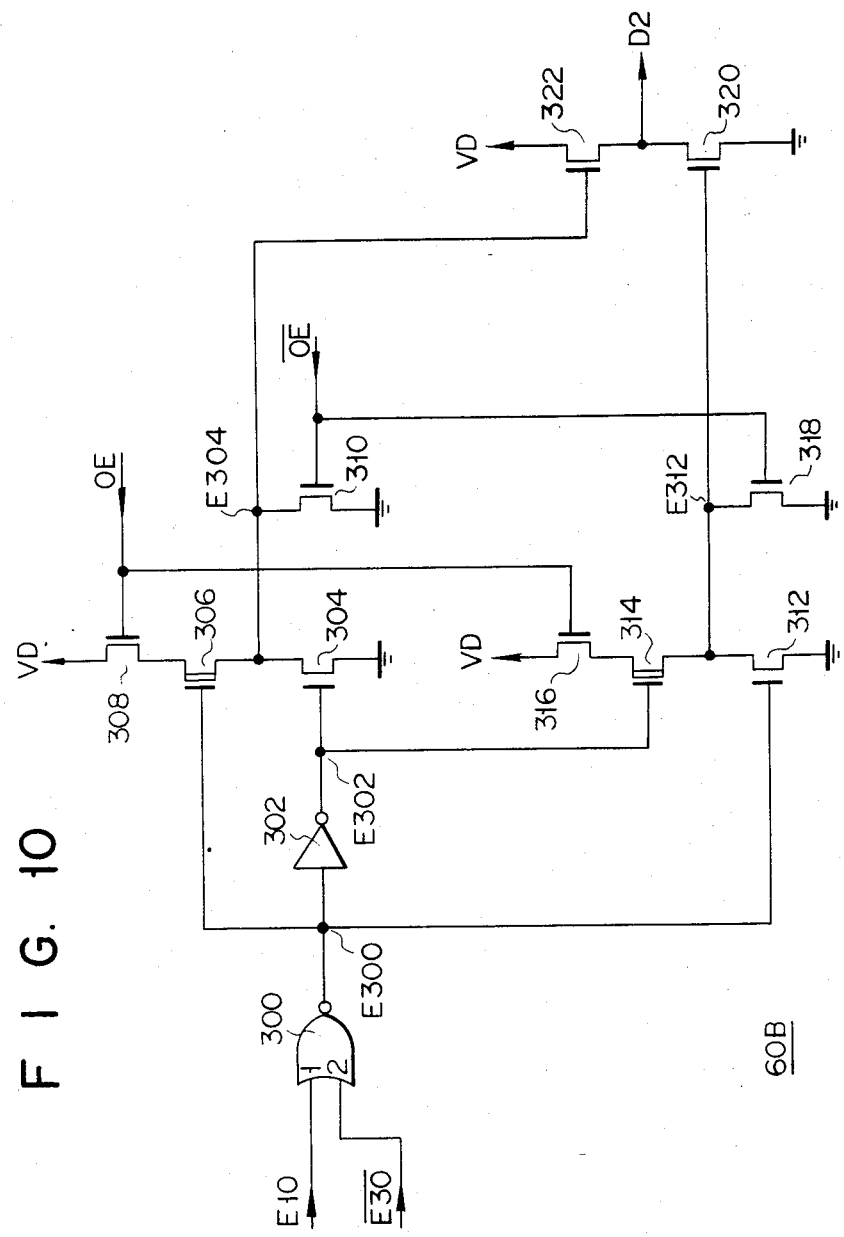

FIG. 10 shows an output buffer or a second selection logic 60B which synthesizes the second stored data D2 (Table 1) from the outputs E10 and e,ovs/E30/ of the comparators 30A and 50A. The outputs E10 and $\overline{E30}$ are input to first and second inputs of a NOR gate 300. A NORed output E300 of the gate 300 is inverted to an inverted output E302 by an inverter 302. The output E302 is supplied to the gate of an enhancement mode MOS transistor 304. The source of the transistor 304 is grounded, and the drain thereof is connected to the source of a depletion mode MOS transistor 306. The output E300 is input to the gate of the transistor 306. The drain of the transistor 306 is connected to the positive supply voltage VD through the source-drain path of an enhancement mode MOS transistor 308. The output enable signal OE is input to the gate of the transistor 308. The drain of the transistor 304 is grounded through the drain-source path of an enhancement mode MOS transistor 310. The inverted output enable signal $\overline{OE}$ is input to the gate of the transistor 310. The levels of the signals OE and $\overline{OE}$ become OE=1 and $\overline{OE}$=0 when enabling the logic 60B.

The output E300 is also supplied to the gate of an enhancement mode MOS transistor 312. The source of the transistor 312 is grounded, and the drain thereof is connected to the source of a depletion mode MOS transistor 314. The output E302 is input to the gate of the transistor 314. The drain of the transistor 314 is connected to the positive supply voltage VD through the source-drain path of an enhancement mode MOS transistor 316. The signal OE is input to the gate of the transistor 316. The drain of the transistor 312 is grounded through the drain-source path of an enhancement mode MOS transistor 318. The signal $\overline{OE}$ is input to the gate of the transistor 318.

An output E312 obtained from the drain of the transistor 312 is connected to the gate of an enhancement mode MOS transistor 320. The source of the transistor 320 is grounded, and the drain thereof is connected to the positive supply voltage VD through the source-drain path of an enhancement mode MOS transistor 322. An output E304 obtained at the drain of the transistor 304 is input to the gate of the transistor 322. The second stored data D2 is obtained from the drain of the transistor 320.

TABLE 2

| VTH | VS | E10 | E20 | $\overline{E30}$ | D1 | D2 |
|---|---|---|---|---|---|---|
| VTH1 | VC1 > VS | 1 | 1 | 0 | 0 | 0 |
| VTH2 | VC2 > VS > VC1 | 0 | 1 | 0 | 0 | 1 |
| VTH3 | VC3 > VS > VC2 | 0 | 0 | 0 | 1 | 1 |
| VTH4 | VS > VC3 | 0 | 0 | 1 | 1 | 0 |

Table 2 is a truth table showing the principle of operation of FIGS. 8 to 10. It is now assumed that the cell transistor 10$ij$ (FIG. 1) wherein VTH=VTH1 is selected. Then, VC1>VS (FIG. 7E). At this time, the comparators 30A and 40A of the construction shown in FIG. 8 output E10=1 and E20=1. Then, E200=0 and E202=1 (FIG. 9). If OE=1 and $\overline{OE}$=0, E204=0, E212=1 and thus D1=0. The comparators 30A and 50A output E10=1 and $\overline{E30}$=0. Since E10=1, E300=0 and E302=1 (FIG. 1). If OE=1 and $\overline{OE}$=0, E304=0 and E312=1, so that D2=0. When the logical states of FIGS. 8 to 10 are considered in a similar manner, the relationships as shown in Table 2 are obtained. The data D1 and D2 may be read out through one readout data line selected by a suitable logic gate which is operative in response to the address data A0 and $\overline{A0}$.

In the circuit of FIG. 9, the logic AND (OE·A0) of signals OE and A0 may be used in place of signal OE and the logic OR ($\overline{OE}+\overline{A0}$) of signals $\overline{OE}$ and $\overline{A0}$ may be used in place of signal $\overline{OE}$. Further, in the circuit of FIG. 10, the logic AND ($\overline{OE}\cdot\overline{A0}$) of signals $\overline{OE}$ and $\overline{A0}$ may be used in place of signal OE and the logic OR (OE+A0) of signals OE and A0 may be used in place of signal $\overline{OE}$. Then, one read out data can be obtained in the drain of the transistor 220 is connected to the drain of the transistor 320. Since A0 and $\overline{A0}$ are not used to select data readout in the FIG. 6–10 system, both data bits D1 and D2 are accessed by a single address code.

Figure 11:
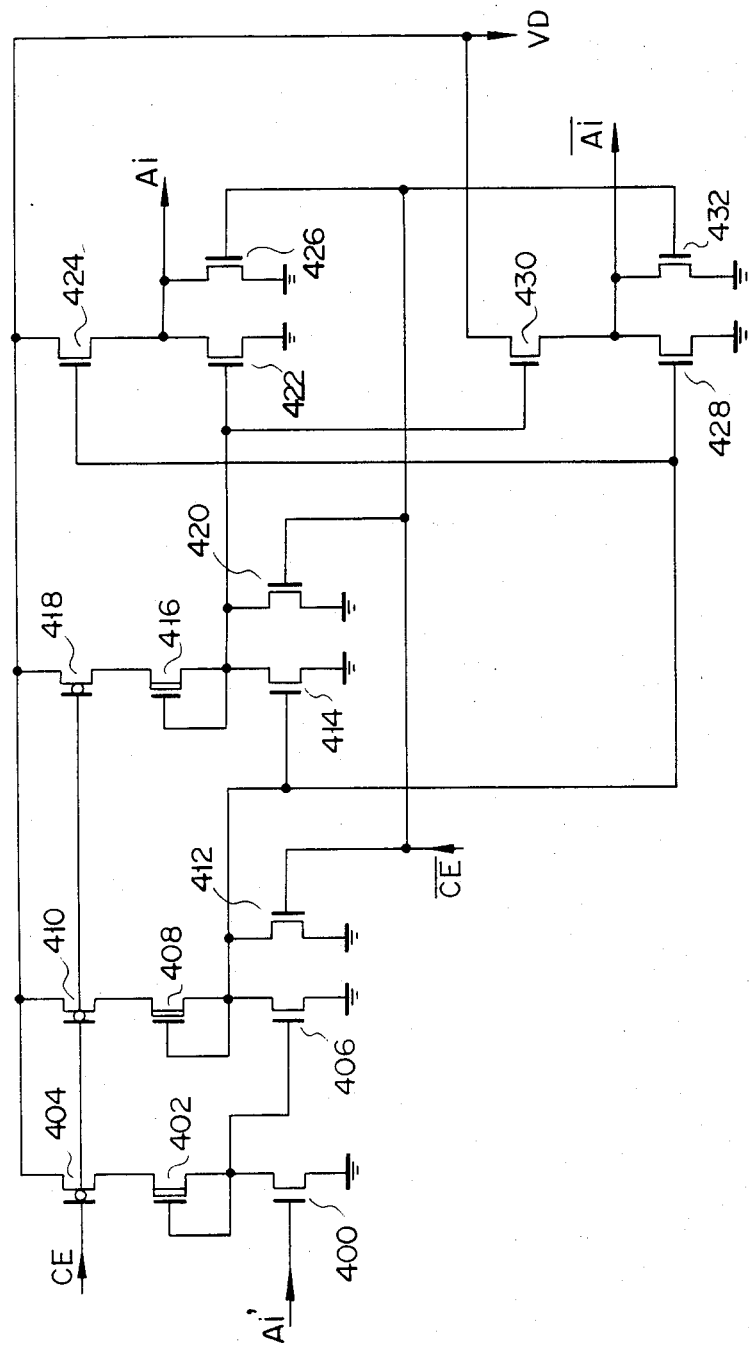
FIG. 11 shows a circuit for generating address data Ai and $\overline{Ai}$ from address data Ai'.

FIG. 11 shows an example of an address buffer circuit for synthesizing address data Ai and $\overline{Ai}$ (FIG. 1) from address data Ai'. The address data Ai' is input to the gate of an enhancement mode MOS transistor 400. The source of the transistor 400 is grounded and the drain thereof is connected to the gate and source of a depletion mode MOS transistor 402. The drain of the transistor 402 is connected to the positive supply voltage VD through the surce-drain path of a zero threshold voltage enhancement mode MOS transistor 404. The drain of the transistor 400 is connected to the gate of an enhancement mode MOS transistor 406. The source of the transistor 406 is grounded, and the drain thereof is connected to the gate and source of a depletion mode MOS transistor 408. The drain of the transistor 408 is connected to the positive supply voltage VD through the source-drain path of a zero threshold voltage enhancement mode MOS transistor 410. The drain of the transistor 406 is grounded through the drain-source path of an enhancement mode MOS transistor 412. The chip enable signal CE is supplied to the gates of the transistors 404 and 410, and the inverted chip enable signal $\overline{CE}$ is supplied to the gate of the transistor 412.

The drain of the transistor 406 is connected to the gate of an enhancement mode MOS transistor 414. The source of the transistor 414 is grounded, and the drain thereof is connected to the gate and source of a depletion mode MOS transistor 416. The drain of the transistor 416 is connected to the positive supply voltage VD through the source-drain path of a zero threshold voltage enhancement mode MOS transistor 418. The signal CE is input to the gate of the transistor 418. The drain of the transistor 414 is grounded through the drain-source path of an enhancement mode MOS transistor 420. The signal $\overline{CE}$ is input to the gate of the transistor 420. The drain of the transistor 414 is connected to the gates of enhancement mode MOS transistors 422 and 430. The drain of the transistor 406 is connected to the gates of enhancement mode MOS transistors 424 and 428. The source of the transistor 422 is grounded, and the drain thereof is connected to the positive supply voltage VD through the source-drain path of the transistor 424. The source of the transistor 428 is grounded, and the drain thereof is connected to the positive supply voltage VD through the source-drain path of the transistor 430. The drains of the transistors 422 and 428 are respectively grounded through the drain-source paths of enhancement mode MOS transistors 426 and 432. Address data Ai (FIG. 1) is obtained from the drain of the transistor 422, and address data $\overline{Ai}$ (FIG. 1) is obtained from the drain of the transistor 428.

Figure 11A:
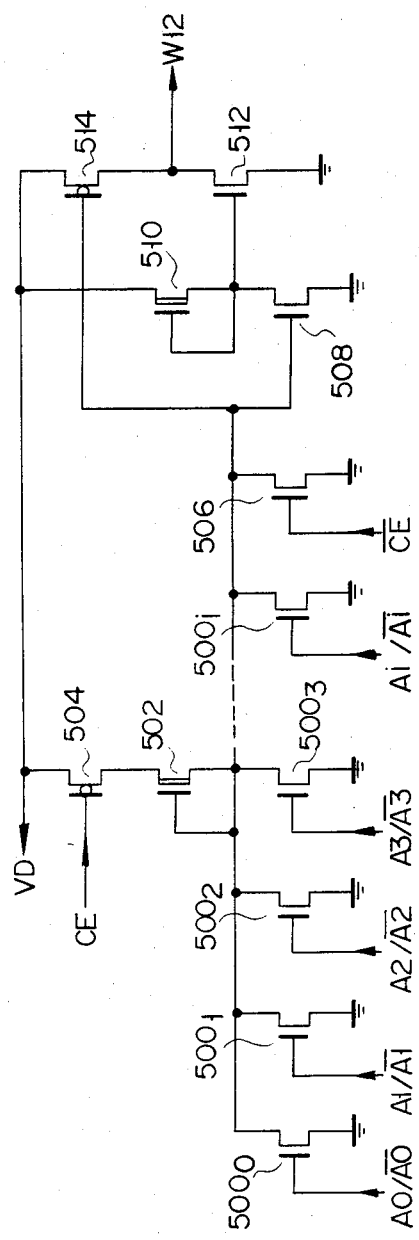
FIG. 11A is a circuit diagram of a row decoder 14 shown in FIGS. 1 and 6.

FIG. 11A shows an example of the circuit configuration of the row decoder 14 (FIGS. 1 and 6). The decoder 14 includes the same number of circuits shown in FIG. 11A as the word lines 12i. However, the word lines 12i and the address data Ai are not necessarily provided in the same number. That is, the number of the word lines may be far greater than that of address data provided. The address data A0 to Ai (or $\overline{A0}$ to $\overline{Ai}$) are respectively input to the gates of enhancement mode MOS transistors $500_0$ to $500_i$. The sources of the transistors $500_i$ are grounded, and the drains thereof are connected to the gate and source of a depletion mode mode MOS transistor 502. The drain of the transistor 502 is connected to the positive supply voltage VD through the source-drain path of a zero threshold voltage enhancement mode MOS transistor 504. The chip enable signal CE is input to the gate of the transistor 504. The source of the transistor 502 is grounded through the drain-source path of an enhancement mode MOS transistor 506. The inverted chip enable signal $\overline{CE}$ is input to the gate of the transistor 506.

The source of the transistor 502 is connected to the gate of an enhancement mode MOS transistor 508 and to the gate of a zero threshold voltage enhancement mode MOS transistor 514. The source of the transistor 508 is grounded, and the drain thereof is connected to the gate and source of a depletion mode MOS transistor 510. The drain of the transistor 510 is connected to the positive supply voltage VD. The drain of the transistor 508 is connected to the gate of an enhancement mode MOS transistor 512. The source of the transistor 512 is grounded, and the drain thereof is connected to the positive supply voltage VD through the source-drain path of the transistor 514. A signal W12 for driving the word line 12 is obtained from the drain of the transistor 512.

FIG. 12 shows a circuit for synthesizing pulses Bi and $\overline{Bi}$ with a predetermined pulse width from the address data Ai and $\overline{Ai}$. Circuits of this construction are used of the same number of address data a0, $\overline{a0}$ . . . and A0, $\overline{A0}$ . . . .

The data Ai is input to the gate of an enhancement mode MOS transistor 600. The source of the transistor 600 is grounded, and the drain thereof is connected to the gate and source of a depletion mode MOS transistor 602. The drain of the transistor 602 is connected to the positive supply voltage VD. The drain of the transistor 600 is connected to the drain of a depletion mode MOS transistor 604. The gate of the transistor 604 is connected to the source thereof which is grounded through a capacitor C60. The source of the transistor 604 is connected to the gate of an enhancement mode MOS transistor 606. The source of the transistor 606 is grounded, and the drain thereof is connected to the gate and source of a depletion mode MOS transistor 608. The drain of the transistor 608 is connected to the positive supply voltage VD through the source-drain path of a zero threshold voltage enhancement mode MOS transistor 610. The chip enable signal CE is supplied to the gate of the transistor 610.

The drain of the transistor 606 is connected to the gate of an enhancement mode MOS transistor 612. The source of the transistor 612 is grounded, and the drain thereof is connected to the gate and source of a depletion mode MOS transistor 614. The drain of the transistor 614 is connected to the positive supply voltage VD. A delayed signal $\overline{DAi}$ obtained from the drain of the transistor 612 is input to the gate of an enhancement mode MOS transistor 616. The address data Ai is supplied to the drain of the drain of the transistor 616, the source of which is connected to the drain of a depletion mode MOS transistor 618. The gate and source of the transistor 618 are grounded. A pulse Bi is obtained from the source of the transistor 616.

The data $\overline{Ai}$ is input to the gate of an enhancement mode MOS transistor 700. The source of the transistor 700 is grounded, and the drain thereof is connected to the gate and source of a depletion mode MOS transistor 702. The drain of the transistor 702 is connected to the positive supply voltage VD. The drain of the transistor 700 is connected to the drain of a depletion mode MOS transistor 704. The gate of the transistor 704 is connected to the source thereof which is grounded through a capacitor C70. The source of the transistor 704 is connected to the gate of an enhancement mode MOS transistor 706. The source of the transistor 706 is grounded, and the drain thereof is connected to the gate and source of a depletion mode MOS transistor 708. The drain of the transistor 708 is connected to the positive supply voltage VD through the source-drain path of a zero threshold voltage enhancement mode MOS transistor 710. The chip enable signal CE is supplied to the gate of the transistor 710.

The drain of the transistor 706 is connected to the gate of an enhancement mode MOS transistor 712. The source of the transistor 712 is grounded, and the drain thereof is connected to the gate and source of a depletion mode MOS transistor 714. The drain of the transistor 714 is connected to the positive supply voltage VD. A delayed signal DAi obtained from the drain of the transistor 712 is input to the gate of an enhancement mode MOS transistor 716. The address data $\overline{Ai}$ is supplied to the drain of the transistor 716, the source of which is connected to the drain of a depletion mode MOS transistor 718. The gate and source of the transistor 718 are grounded. A pulse $\overline{Bi}$ is obtained from the source of the transistor 716.

Figure 13:
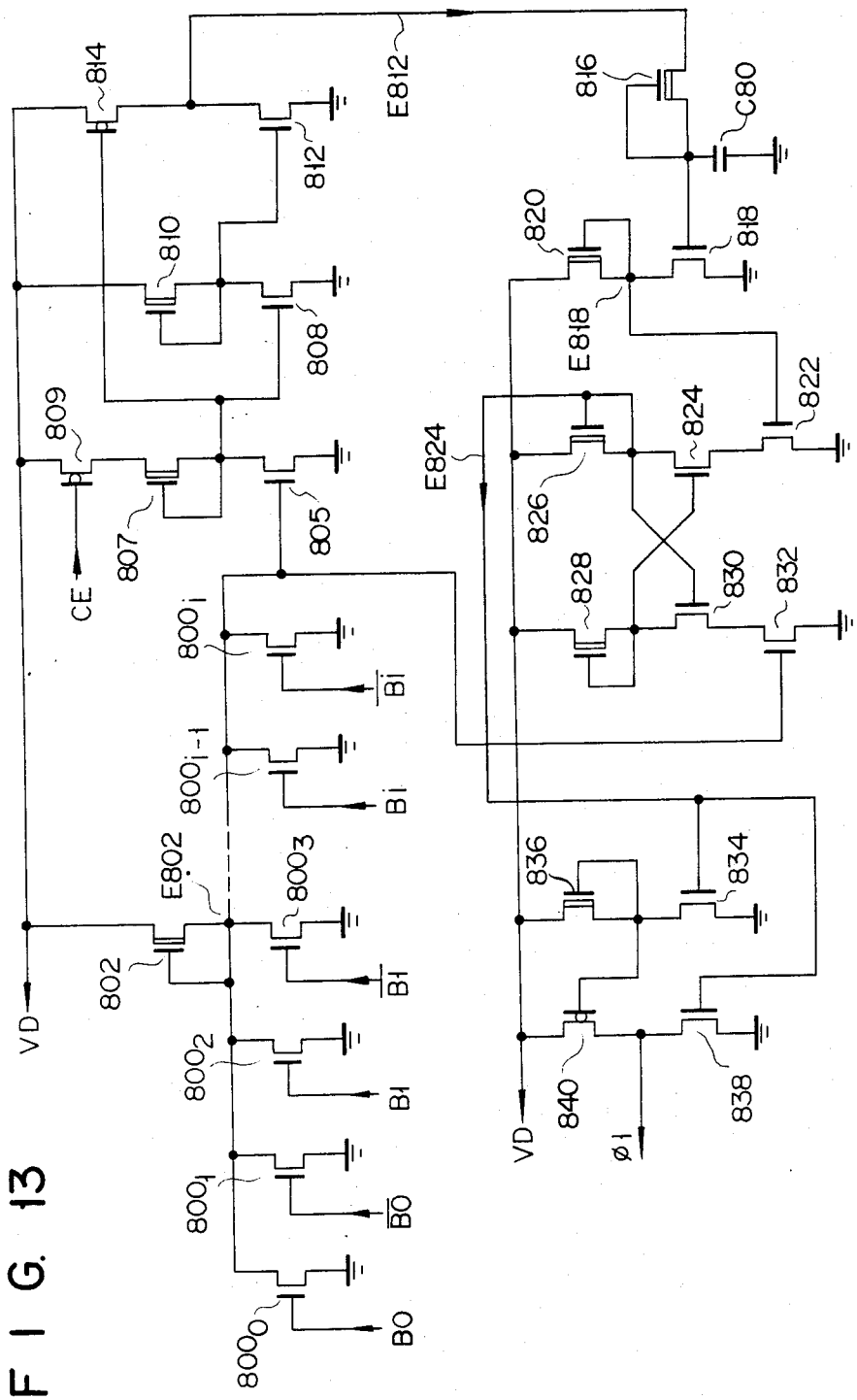
FIG. 13 shows a circuit for generating a pulse $\phi 1$ from the pulses Bi and $\overline{Bi}$.

FIG. 13 shows a circuit for synthesizing the discharge pulse $\phi 1$ from the pulses Bi and $\overline{Bi}$. Where the suffix i of Bi and $\overline{Bi}$ indicates all address numbers of the data a0, $\overline{a0}$ ... and A0, $\overline{A0}$ .... The pulses Bi and $\overline{Bi}$ are input to the gates of enhancement mode MOS transistors $800_0$ to $800_i$. The sources of the transistors $800_i$ are grounded. The drains of the transistors $800_i$ are connected to the gate and source of a depletion mode MOS transistor 802. The drain of the transistor 802 is connected to the positive supply voltage VD. A signal E802 obtained from the source of the transistor 802 is input to the gate of an enhancement mode MOS transistor 805. The source of the transistor 805 is grounded, and the drain thereof is connected to the gate and source of a depletion mode MOS transistor 807. The drain of the transistor 807 is connected to the positive supply voltage VD through the source-drain path of a zero threshold voltage enhancement mode MOS transistor 809. The chip enable signal CE is input to the gate of the transistor 809.

The drain of the transistor 805 is connected to the gate of an enhancement mode MOS transistor 808 and to the gate of a zero threshold voltage enhancement mode MOS transistor 814. The source of the transistor 808 is grounded, and the drain thereof is connected to the gate and source of a depletion mode MOS transistor 810. The drain of the transistor 810 is connected to the positive supply voltage VD. The drain of the transistor 808 is connected to the gate of an enhancement mode MOS transistor 812. The source of the transistor 812 is grounded, and the drain thereof is connected to the positive supply voltage VD through the source-drain path of the transistor 814. A signal E812 is obtained from the drain of the transistor 812.

The signal E812 is supplied to the drain of a depletion mode MOS transistor 816. The gate and source of the transistor 816 are grounded through a capacitor C80. The transistor 816 and the capacitor C80 from a delay means. The source of the transistor 816 is connected to the gate of an enhancement mode MOS transistor 818. The source of the transistor 818 is grounded, and the drain thereof is connected to the gate and source of a depletion mode MOS transistor 820. The drain of the transistor 820 is connected to the positive supply voltage VD.

A delayed signal E818 obtained from the drain of the transistor 818 is input to the gate of an enhancement mode MOS transistor 822. The source of the transistor 822 is grounded, and the drain thereof is connected to the source of an enhancement mode MOS transistor 824. The drain of the transistor 824 is connected to the gate and source of a depletion mode MOS transistor 826. The gate of the transistor 824 is connected to the gate and source of a depletion mode MOS transistor 828. The drains of the transistors 826 and 828 are connected to the positive supply voltage VD. The source of the transistor 828 is connected to the drain of an enhancement mode MOS transistor 830. The gate of the transistor 830 is connected to the source of the transistor 826, and the source of the transistor 830 is grounded through the drain-source path of an enhancement mode MOS transistor 832. The signal E802 is input to the gate of the transistor 832.

A signal E824 obtained from the drain of the transistor 824 is supplied to the gates of enhancement mode MOS transistors 834 and 838. The sources of the transistors 834 and 838 are grounded. The drain of the transistor 834 is connected to the gate and source of a depletion mode MOS transistor 836, and to the gate of a zero threshold voltage enhancement mode MOS transistor 840. The drains of the transistors 836 and 840 are connected to the positive supply voltage VD. The source of the transistor 840 is connected to the drain of the transistor 838, from the drain of which is output the discharge pulse $\phi 1$.

Figure 14:
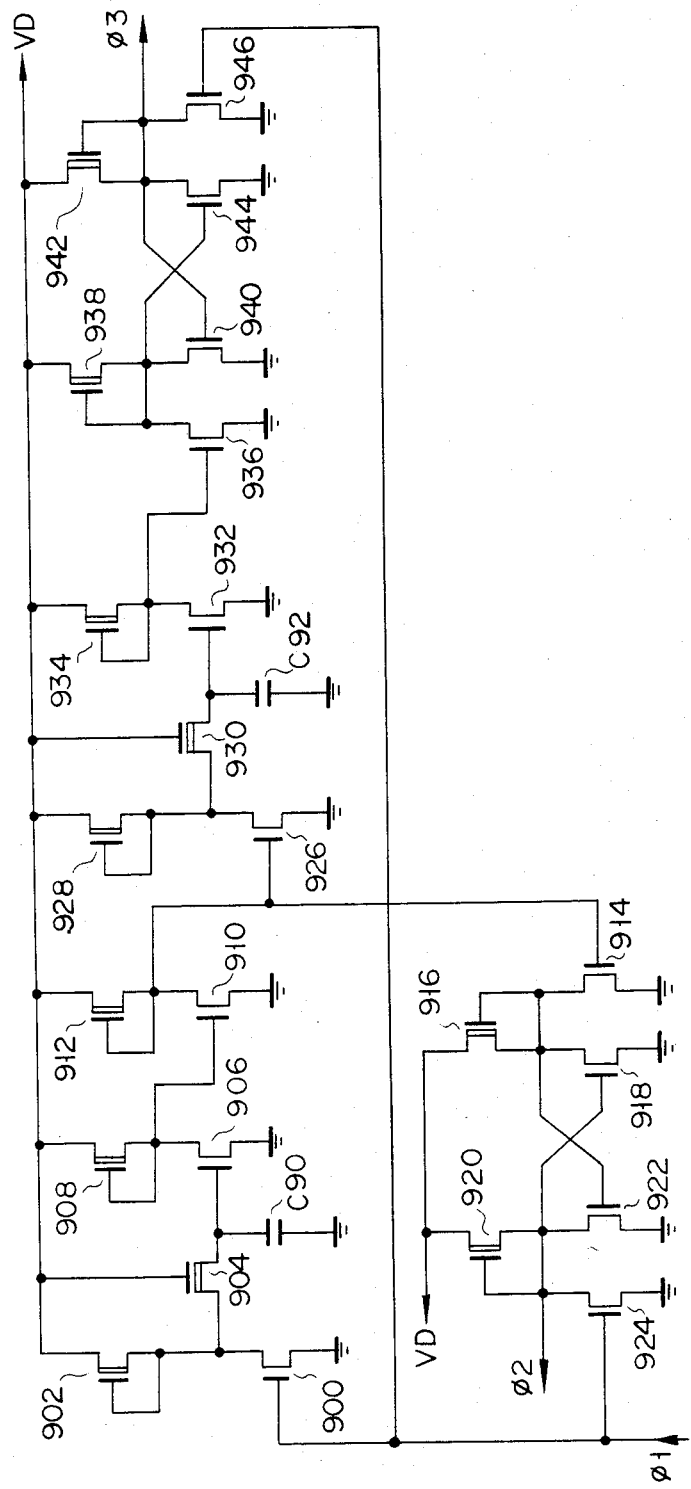
FIG. 14 shows a circuit for generating pulses $\phi 2$ and $\phi 3$ from the pulse $\phi 1$.

FIG. 14 shows a circuit for synthesizing the charge pulse $\phi 2$ and the timing pulse $\phi 3$ from the pulse $\phi 1$. The pulse $\phi 1$ is input to the gate of an enhancement mode MOS transistor 900. The source of the transistor 900 is grounded, and the drain thereof is connected to the gate and source of a depletion mode MOS transistor 902. The drain of the transistor 902 is connected to the positive supply voltage VD. The drain of the transistor 900 is connected to the gate of an enhancement mode MOS transistor 906 through the drain-source path of a depletion mode MOS transistor 904. The gate of the transistor 904 is connected to the positive supply voltage VD, and the source thereof is grounded through a capacitor C90. The source of the transistor 906 is grounded, and the drain thereof is connected to the gate and source of a depletion mode MOS transistor 908. The drain of the transistor 908 is connected to the positive supply voltage VD. The drain of the transistor 906 is connected to the gate of an enhancement mode MOS transistor 910. The source of the transistor 910 is grounded, and the drain thereof is connected to the gate and source of a depletion mode MOS transistor 912. The drain of the transistor 912 is connected to the positive supply voltage VD.

The drain of the transistor 910 is connected to the gate of an enhancement mode MOS transistor 914. The source of the transistor 914 is grounded, and the drain thereof is connected to the gate and source of a depletion mode MOS transistor 916. The soruce of the transistor 916 is grounded through the drain-source path of an enhancement mode MOS transistor 918. The gate of the transistor 918 is connected to the gate and source of a depletion mode MOS transistor 920. The drains of the transistors 916 and 920 are connected to the positive supply voltage VD. The source of the transistor 920 is grounded through each of the drain-source paths of enhancement mode MOS transistors 922 and 924. The gate of the transistor 922 is connected to the source of the transistor 916. The pulse $\phi 1$ is input to the gate of the transistor 924. The charge pulse $\phi 2$ is obtained from the source of the transistor 920.

The drain of the transistor 910 is also connected to the gate of an enhancement mode MOS transistor 926. The source of the transistor 926 is grounded, and the drain thereof is connected to the gate and source of a depletion mode MOS transistor 928. The drain of the transistor 928 is connected to the positive supply voltage VD. The drain of the transistor 926 is connected to the gate of an enhancement mode MOS transistor 932 through the drain-source path of a depletion mode MOS transistor 930. The gate of the transistor 930 is connected to the positive supply voltage VD, and the source thereof is grounded through a capacitor C92. The source of the transistor 932 is grounded, and the drain thereof is connected to the gate and source of a depletion mode MOS transistor 934. The drain of the transistor 934 is connected to the positive supply voltage VD.

The drain of the transistor 932 is connected to the gate of an enhancement mode MOS transistor 936. The source of the transistor 936 is grounded, and the drain thereof is connected to the gate and source of a depletion mode MOS transistor 938. The drain of the transistor 938 is connected to the positive supply voltage VD. The source of the transistor 938 is grounded through the drain-source path of an enhancement mode MOS transistor 940. The gate of the transistor 940 is connected to the gate and source of a depletion mode MOS transistor 942. The drain of the transistor 942 is connected to the positive supply voltage VD. The source of the transistor 942 is grounded through each of the drain-source paths of enhancement mode MOS transistors 944 and 946. The gate of the transistor 944 is connected to the source of the transistor 938, and the pulse $\phi 1$ is input to the gate of the transistor 946. The timing pulse $\phi 3$ is obtained from the source of the transistor 942.

The transistors 900 to 912 constitute an inverted delay line, and the transistors 926 to 934 constitute a non-inverted delay line. The transistors 914 to 924 and the transistors 936 to 946 respectively constitute flip-flops which are reset by the pulse $\phi 1$.

FIGS. 15A to 15M, 16, and 16A to 16M are timing charts showing the mode of operation of the circuitry shown in FIGS. 11 to 14. FIGS. 15A to 15M show the manner in which the pulses $\phi 1$ to $\phi 3$ are obtained according to the change in address data Ai′ when CE=1 and $\overline{CE}$=0. Although the time delay by the delay line is shown, the operation delay of the gates, inverters and so on is omitted by supposing they are negligible.

It is now assumed that the data Ai′ changes from logic 1 to logic 0 at a time t20 (FIG. 15A). The data Ai′ passes through three stages of the inverters (400, 406, 414) and the buffer circuit (422) shown in FIG. 11 to become address data Ai (FIG. 15B) of the same phase as that of the data Ai′. The data Ai′ passes through three stages of the inverters (400, 406, 414) and the buffer circuit (428) to become address data $\overline{Ai}$ (FIG. 15C) of the opposite phase to that of the data Ai′. The data Ai becomes a delayed signal $\overline{DAi}$ through the inverter 600, the delay capacitor C60, and inverters 600 and 612 shown in FIG. 12. The level change (t23) of the signal $\overline{DAi}$ is delayed from the level change (t20) of the data Ai by a predetermined time interval (t20 to t23; FIG. 15E). Similarly, the data $\overline{Ai}$ is converted to a delayed signal DAi through inverters (700, 706, 712) and a delay capacitor C70. The level change (t20) of the data $\overline{Ai}$ is delayed by a predetermined time interval (t20 to t23) to bring about the level change (t23) of the signal DAi (FIG. 15D). Although the delay times of the signals DAi and $\overline{DAi}$ are the same here, they may be different. These delay times are suitably changed according to the pulse widths of the pulses Bi and $\overline{Bi}$ to be described hereinafter.

When the data Ai′ changes from level 0 to level 1 at a time t30, the data Ai and $\overline{Ai}$ also undergo level changes (FIGS. 15A to 15C). The level change (t30) of the data $\overline{Ai}$ is delayed by a predetermined time interval (t30 to t33) to bring about the level change (t33) of the signal DAi (FIG. 15D). Similarly, the level change of the data Ai at the time t30 brings about the level change of the signal $\overline{DAi}$ (FIG. 15E) at the time t33. The pulse Bi corresponds to the data Ai which is gated by the signal $\overline{DAi}$. Thus, the pulse Bi becomes logic 1 (FIGS. 15B, 15E, 15F) only during the time interval of Ai=$\overline{DAi}$=1 (t30 to t33). The pulse $\overline{Bi}$ corresponds to the data $\overline{Ai}$ gated by the signal DAi. The pulse $\overline{Bi}$ becomes logic 1 (FIGS. 15C, 15D, 15G) only during the time interval of $\overline{Ai}$=DAi=1 (t20 to t23).

The pulses Bi and $\overline{Bi}$ are input to the transistors 800$_i$ shown in FIG. 13. The pulses Bi and $\overline{Bi}$ are converted into the signal E802 which becomes logic 0 (FIG. 15H) when either of the pulses Bi or $\overline{Bi}$ becomes logic 1 (t20 to t23; t30 to t33). The signal E802 is converted into a signal E812 of the opposite phase to that of the signal E802 (FIG. 15I) through the inverters 805 to 814 having a like configuration of the row decoder shown in FIG. 11. The signal E812 is delayed by a predetermined time interval (t20 to t22; t30 to t33) by the delay capacitor C80, and is phase-inverted by the inverter 818 to become a delayed signal E818 (FIG. 15J). The level changes from 0 to 1 of the signal E812 at the times t20 and t30 bring about the changes from 1 to 0 of the signal E818 at the times t22 and t32.

The flip-flops 822 to 832 are set by the logic 0 of the signal E802 at the time t20 (or t30) (FIG. 15H) to output the signal E824 of logic 0 (not shown). The signal E824 is phase-inverted by the inverters 834 to 840 to become the pulse $\phi 1$ (FIG. 15K). When the time t22 (or t32) arrives, the flip-flops 822 to 832 are reset by the logic 0 of the delayed signal E818 (FIG. 15J). Then, the pulse $\phi 1$ returns to logic 0. Thus, the pulse $\phi$=1 at the time t20 (or t30) since E802=0, and the pulse $\phi 1$=0 at the time t22 (or t32) since E818=0. The pulse width of the pulse $\phi 1$ is determined by the delay time (t20 to t22; t30 to t32).

The flip-flops 914 to 924 and 936 to 946 shown in FIG. 14 are set by the pulse $\phi$=1 at the time t20 (or t30). Then, $\phi 2$=0 and $\phi 3$=0 (FIGS. 15K to 15M). After a first predetermined time interval T1 (t20 to t24 or t30 or t34), the flip-flops 914 to 924 are reset by the output 0→1 of the inverter 910. Then, the pulse $\phi 2$ returns to 1 at a time t24 (or t34) (FIG. 15L). Similarly, after second predetermined time interval T2 (t20 or t26 or t30 to t36), the flip-flops 936 to 946 are reset by the output 0→1 of the inverter 932. Then, the pulse $\phi 3$ returns to 1 at a time t26 (or t36) (FIG. 15M). The first predetermined time interval T1 is determined by the delay time of the delay capacitor C90. The second predetermined time interval T2 is determined by the delay time of the delay capacitors C90 and C92.

The delay time of the delay capacitor C90 in FIG. 14 corresponds to the time interval t22 to t24, and the delay time of the delay capacitor C92 corresponds to the time interval t24 to t26. In this manner, the time constants of the delay circuits (904, C90; 930, C92) may be made smaller than those obtainable when the time delay is performed from the time t20. This is advantageous for IC circuits.

FIG. 16 and 16A to 16M show how the pulses $\phi1$ to $\phi3$ are produced according to the level change of the chip enable signal CE. CE=0 and $\overline{CE}$=1 before a time t40 (FIG. 16). Since transistors 426 and 432 shown in FIG. 11 are turned on, Ai=$\overline{Ai}$=0 regardless of the level of the data Ai' (FIGS. 16A to 16C). In this case, both the data DAi and $\overline{DAi}$ are logic 1 (FIGS. 16D and 16E). When CE=1 and $\overline{CE}$=0 at the time t40, the circuitry in FIG. 11 becomes responsive to the logic level of the data Ai'. Since Ai'=0 at the time t40, Ai=0 and $\overline{Ai}$=1 (FIGS. 16A to 16C). The level change from 0 to 1 of $\overline{Ai}$ is delayed by a predetermined time interval (t40 to t43) to bring about the level change of 1 to 0 DAi at a time T43 (FIG. 16D).

$\overline{Bi}$=1 is obtained (FIG. 16G) since $\overline{Ai}$=DAi=1 during the time interval (t40 to t43). When CE=0 and $\overline{CE}$=1 at a time t48, the same logical states as obtained before the time t40 are obtained (FIGS. 16 and 16A to 16G).

Subsequently, cases will be considered wherein Ai'=1 (FIG. 16A) at a time t50, and CE=1 and $\overline{CE}$=0 at a time t60 (FIG. 16). In this case, since Ai'=1, Ai=1 and $\overline{Ai}$=0 (FIGS. 16B and 16C). The level change from 0 to 1 of Ai is delayed by a predetermined time interval (t60 to t63) to bring about the level change of 1 to 0 of $\overline{DAi}$ at a time t63 (FIG. 16E). During the time interval (t60 to t63), Bi=1 since Ai=$\overline{DAi}$=1 (FIG. 16F). Since the operation (FIGS. 16H to 16M) after the pulses Bi and $\overline{Bi}$ are obtained is the same as that described with reference to FIGS. 15H to 15M, the description thereof will be omitted.

With the circuit configuration shown in FIGS. 11 to 14, the pulses $\phi1$ to $\phi3$ for reading out the stored data are synthesized in synchronism with the level change of the address data Ai' or the chip enable signal CE. Thus, the ROM shown in FIG. 6 may immediately start high speed readout operation when the IC chip of this ROM is accessed.

It is desired that the delay means shown in FIG. 13 (i.e. the transistor 816 and the capacitor C80) have a resistance and a capacitance which are equal to or greater than those of the word line. If the delay means has such resistance and capacitance, the word line selected will uniformly be charged to logic "1" level, and the pulse $\phi1$ comes to have logic "1" level and the pulse $\phi2$ comes to have also logic "1" level, thereby rendering the operation stable.

If the word line selected reaches "1" level extractly at time t24, data can be read out at more high speed. To make the word line to reach "1" level at time t24 it is sufficient to design the delay means shown in FIG. 13 and the delay means shown in FIG. 14 (i.e. the transistor 904 and the capacitor C90) so that the sum of their delay times elapses at time t24.

The present invention is not limited to the particular embodiments described above. For example, in the embodiments described above, all of the transistors were of n-channel type. However, transistors of p-channel type may be similarly used.

In summary, according to the present invention, the data line potentials at the time of completion of the charging or discharging of the data lines of the MOS transistors for memory cells were set at four different levels. Therefore, 2-bit data may be stored in a single memory cell, so that a semiconductor IC memory may be provided in which the chip size may be decreased. Further, when eight kinds of data line potentials are used, 3-bit data can be stored in one memory cell. This fact expands the application of the invention. That is, according to the present invention plural bits or N-bit data can be stored in one cell.

What is claimed is:
1. A semiconductor IC memory comprising:
(a) memory means having memory cells for storing given data, each of said memory cells simultaneously storing plural bits of binary data and having a predetermined threshold level determining the potential of a sense point, said predetermined threshold level being selected from a plurality of fixed levels;
(b) data lines coupled to said memory cells for transferring data stored in said memory cells;
(c) decoder means coupled to the sense point of said memory means and to said data lines, for selecting one of said memory cells to couple the selected memory cell with said sense point, the potential of the data line coupled to said selected memory cell being changed with the stored data of said selected memory cell; and
(d) sensor means coupled to said sense point for sensing said data line potential to provide a read out data corresponding to the stored data of said selected memory cell, said sensor means including comparator means coupled to said sense point for comparing said sense point potential with given comparison levels and providing a comparison result corresponding to said predetermined threshold level, logic means coupled to said comparator means and responsive to the logical state of said comparison result, for providing an output corresponding to said read out data, at least one dummy cell, at least one dummy line coupled to said dummy cell and said comparator means, for generating at least one of said given comparison levels, and a charge/discharge means coupled to said data lines and dummy line for discharging said data lines and dummy line at substantially the same time and for charging said data lines and dummy line at substantially the same time.

2. A memory of claim 1, wherein said charge/discharge means includes comparison control means coupled to said comparator means for enabling the comparison between said sense point potential and at least one of said given comparison levels at the time when a potential change rate of said sense point potential and that of said given comparison level substantially appear not to be zero.

3. A memory of claim 1 or 2, wherein read out operation of the memory is enabled by a chip enable signal, and said charge/discharge means is coupled to said comparator means and decoder means, and enables said comparator means to perform the comparison between said sense point potential and one of said given comparison levels when an address data applied to said decoder means and said chip enable signal change.

4. A memory of claim 3, wherein said charge/discharge means includes:
- first pulse generator means responsive to at least one of said address data and chip enable signal for generating a first pulse;
- discharger means coupled to said data lines and dummy line for discharging said data lines and dummy line at the time when said first pulse is generated;
- second pulse generator means for generating a second pulse;
- charger means coupled to said data lines and dummy line for charging said data lines and dummy line at the time when said second pulse is generated; and
- third pulse generator means for generating a third pulse, said comparator means being responsive to said third pulse and performing said comparison under the generation of said third pulse.

5. A memory of claim 4, wherein each of said memory cells is formed of a MOS transistor having a prdetermined gate channel width, said predetermined gate channel width corresponding to the contents of said plural bits of binary data stored in said memory cell.

6. A memory of claim 5, wherein each of said memory cells is formed of a MOS transistor having a predetermined gate channel length, said predetermined gate channel length corresponding to the contents of said plural bits of binary data stored in said memory cell.

7. A memory of claim 4, wherein each of said memory cells is formed of a MOS transistor having a predetermined gate channel length, said predetermined gate channel length corresponding to the contents of said plural bits of binary data stored in said memory cell.

8. A memory of claim 3, wherein each of said memory cells is formed of a MOS transistor having a predetermined gate channel width, said predetermined gate channel width corresponding to the contents of said plural bits of binary data stored in said memory cell.

9. A memory of claim 8, wherein each of said memory cells is formed of a MOS transistor having a predetermined gate channel length, said predetermined gate channel length corresponding to the contents of said plural bits of binary data stored in said memory cell.

10. A memory of claim 3, wherein each of said memory cells is formed of a MOS transistor having a predetermined gate channel length, said predetermined gate channel length corresponding to the contents of said plural bits of binary data stored in said memory cell.

11. A memory of claims 1 or 2, wherein each of said memory cells is formed of a MOS transistor having a predetermined gate channel width, said predetermined gate channel width corresponding to the contents of said plural bits of binary data stored in said memory cell.

12. A memory of claim 11, wherein each of said memory cells is formed of a MOS transistor having a predetermined gate channel length, said predetermined gate channel length corresponding to the contents of said plural bits of binary data stored in said memory cell.

13. A memory of claims 1 or 2, wherein each of said memory cells is formed of a MOS transistor having a predetermined gate channel length, said predetermined gate channel length corresponding to the contents of said plural bits of binary data stored in said memory cell.

14. A memory of claims 1 or 2, wherein said logic means includes gate means responsive to a specific address data for gating said comparison result to provide said output, the logical state of said output depending upon the logical state of said address data when one of said two bits data differs from the other thereof.

15. A memory of claims 1 or 2, wherein there are provided four different potentials for said predetermined threshold level, and
said comparator means includes:
- a first comparator coupled to said sense point for comparing said sense point potential with a first given comparison level and providing a first comparison output;
- a second comparator coupled to said sense point for comparing said sense point potential with a second given comparison level and providing a second comparison output; and
- a third comparator coupled to said sense point for comparing said sense point potential with a third given comparison level and providing a third comparison output;
- said first, second and third given comparison levels corresponding to said given comparison levels of said comparator means; and said first, second and third comparison outputs corresponding to said comparison result.

16. A memory of claim 15, wherein said sensor means further includes:
- a first level source coupled to said first comparator for generating said first given comparison level which corresponds to a first threshold level of said four predetermined threshold levels;
- a second level source coupled to said second comparator for generating said second given comparison level which corresponds to a second threshold level of said four predetermined threshold level; and
- a third level source coupled to said third comparator for generating said third given comparison level which corresponds to a third threshold level of said four predetermined threshold levels.

17. A memory of claim 16, wherein said memory cells include:
- a first MOS transistor whose gate threshold voltage corresponds to said first threshold level;
- a second MOS transistor whose gate threshold voltage corresponds to said second threshold level;
- a third MOS transistor whose gate threshold voltage corresponds to said third threshold level; and
- a fourth MOS transistor whose gate threshold voltage corresponds to a fourth threshold level of said four predetermined threshold levels;
- and wherein said first level source includes a forwardly biased MOS transistor with said first threshold level whose voltage drop is substantially same as that of said first MOS transistor;
- said second level source includes a forwardly biased MOS transistor with said second threshold level whose voltage drop is substantially same as that of said second MOS transistor; and
- said third level source includes a forwardly biased MOS transistor with said third threshold level whose voltage drop is substantially same as that of said third MOS transistor.

18. A memory of claim 16, wherein said memory cells include:
- a first MOS transistor whose gate threshold voltage corresponds to said first threshold level;
- a second MOS transistor whose gate threshold voltage corresponds to said second threshold level;

a third MOS transistor whose gate threshold voltage corresponds to said third threshold level; and a fourth MOS transistor whose gate threshold voltage corresponds to a fourth threshold level of said four predetermined threshold levels;

and wherein said first level source includes:

a first dummy MOS transistor whose gate threshold voltage corresponds to the level between said first and second threshold levels;

a second dummy MOS transistor whose gate threshold voltage corresponds to the level between said second and third threshold levels; and a third dummy MOS transistor whose gate threshold voltage corresponds to the level between said third and fourth threshold levels.

19. A semiconductor IC memory comprising:
   (a) memory means having memory cells for storing given data, each of said memory cells simultaneously storing two bits of binary data and having a predetermined threshold level determining the potential of a sense point, said predetermined threshold level being selected from a plurality of fixed levels;
   (b) data lines coupled to said memory cells for transferring data stored in said memory cells;
   (c) decoder means coupled to the sense point of said memory means and to said data lines, for selecting one of said memory cells to couple the selected memory cell with said sense point, the potential of the data line coupled to said selected memory cell being changed with the stored data of said selected memory cell;
   (d) comparator means coupled to said sense point for comparing said sense point potential with given comparison levels and providing a comparison result corresponding to said predetermined threshold level;
   (e) logic means coupled to said comparator means and responsive to the logical state of said comparison result, for providing an output corresponding to said read out data;
   (f) at least one dummy cell;
   (g) at least one dummy line coupled to said dummy cell and said comparator means, for generating at least one of said given comparison levels; and
   (h) charge/discharge means coupled to said data lines and dummy line for discharging said data lines and dummy line at substantially the same time and for charging said data lines and said dummy line at substantially the same time.

20. A memory of claim 19, wherein said charge/discharge means is coupled to said comparator means and decoder means, and enables said comparator means to perform the comparison between said sense point potential and one of said comparison levels at the time when at least one of an address data applied to said decoder means and a chip enable signal applied to the memory changes.

21. A memory of claim 20, wherein said charge/discharge means includes:

first pulse generator means responsive to at least one of said address data and chip enable signal for generating a first pulse;

discharger means coupled to said data lines and dummy line for discharging said data lines and dummy line at the time when said first pulse is generated;

second pulse generator means for generating a second pulse;

charger means coupled to said data lines and dummy line for charging said data lines and dummy line at the time when said second pulse is generated;

third pulse generator means for generating a third pulse, said comparator means being responsive to said third pulse and performing said comparison under the generation of said third pulse.

22. A semiconductor IC memory comprising:
   (a) memory means having memory cells for storing given data, each of said memory cells simultaneously storing two bits of binary data and having a predetermined threshold level determining the potential of a sense point, said predetermined threshold level being selected from a plurality of fixed levels;
   (b) data lines coupled to said memory cells for transferring data stored in said memory cells;
   (c) decoder means coupled to the sense point of said memory means and to said data lines, for selecting one of said memory cells to couple the selected memory cell with said sense point, the potential of the data line coupled to said selected memory cell being changed with the stored data of said selected memory cell;
   (d) comparator means coupled to said sense point for comparing said sense point potential with given comparison levels and providing a comparison result corresponding to said predetermined threshold level;
   (e) logic means coupled to said comparator means and responsive to the logical state of said comparison result, for providing an output corresponding to said read out data;
   (f) at least one dummy cell;
   (g) at least one dummy line coupled to said dummy cell and said comparator means, for generating at least one of said given comparison levels; and
   (h) comparison control means coupled to said comparator means for enabling the comparison between said sense point potential and at least one of said given comparison levels at the time when a potential change rate of said sense point potential and that of said given comparison level substantially appear not to be zero.

23. A memory of any one of claims 19 to 22, wherein each of said memory cells is formed of a MOS transistor having a predetermined gate channel width, said predetermined gate channel width corresponding to said predetermined threshold level.

24. A memory of any one of claims 19 to 22, wherein each of said memory cells is formed of a MOS transistor having a predetermined gate channel length, said predetermined gate channel length corresponding to said predetermined threshold level.

25. A memory of any one of claims 19 to 22, wherein there are provided four different potentials for said predetermined threshold level, and said comparator means includes:

a first comparator coupled to said sense point for comparing said sense point potential with a first given comparison level and providing a first comparison output;

a second comparator coupled to said sense point for comparing said sense point potential with a second given comparison level and providing a second comparison output;

and a third comparator coupled to said sensed point for comparing said sense point potential with a third given comparison level and providing a third comparison output;

said first, second and third given comparison levels corresponding to said given comparison levels of said comparator means; and said first, second and third comparison outputs corresponding to said comparison result.

26. A memory of claim 25, further comprising:

a first level source coupled to said first comparator for generating said first given comparison level which corresponds to a first threshold level of said four predetermined threshold levels;

a second level source coupled to said second comparator for generating said second given comparison level which corresponds to a second threshold level of said four predetermined threshold levels; and a third level source coupled to said third comparator for generating said third given comparison level which corresponds to a third threshold level of said four predetermined threshold levels.

27. A memory of claim 26, wherein said memory cells include:

a first MOS transistor whose gate threshold voltage corresponds to said first threshold level;

a second MOS transistor whose gate threshold voltage corresponds to said second threshold level;

a third MOS transistor whose gate threshold voltage corresponds to said third threshold level; and a fourth MOS transistor whose gate threshold voltage corresponds to a fourth threshold level of said four predetermined threshold levels;

and wherein said first level source includes a forwardly biased MOS transistor with said first threshold level whose voltage drop is substantially same as that of said first MOS transistor;

said second level source includes a forwardly biased MOS transistor with said second threshold level whose voltage drop is substantially same as that of said second MOS transistor; and said third level source includes a forwardly biased MOS transistor with said third threshold level whose voltage drop is substantially same as that of said third MOS transistor.

28. A memory of claim 26, wherein said memory cells include:

a first MOS transistor whose gate threshold voltage corresponds to said first threshold level;

a second MOS transistor whose gate threshold voltage corresponds to said second threshold level;

a third MOS transistor whose gate threshold voltage corresponds to said third threshold level; and a fourth MOS transistor whose gate threshold voltage corresponds to a fourth threshold level of said four predetermined threshold levels;

and wherein said first level source includes:

a first dummy MOS transistor whose gate threshold voltage corresponds to the level between said first and second threshold levels;

a second dummy MOS transistor whose gate threshold voltage corresponds to the level between said second and third threshold levels; and a third dummy MOS transistor whose gate threshold voltage corresponds to the level between said third and fourth threshold levels.

29. A memory of any one of claims 19 to 22, wherein said logic means includes gate means responsive to a specific address data for gating said comparison result to provide said output, the logical state of said output depending upon the logic state of said address data when one of said two bits data differs from the other thereof.

30. A memory of claim 29, further comprising: a first level source coupled to said first comparator for generating said first given comparison level which corresponds to a first threshold level of said four predetermined threshold levels;

a second level source coupled to said second comparator for generating said second given comparison level which corresponds to a second threshold level of said fourth predetermined threshold levels; and a third level source coupled to said third comparator for generating said third given comparison level which corresponds to a third threshold level of said four predetermined threshold levels.

31. A memory of claim 30, wherein said memory cells include:

a first MOS transistor whose gate threshold voltage corresponds to said first threshold level;

a second MOS transistor whose gate threshold voltage corresponds to said second threshold level;

a third MOS transistor whose gate threshold voltage corresponds to said third threshold level; and a fourth MOS transistor whose gate threshold voltage corresponds to a fourth threshold level of said four predetermined threshold levels;

and wherein said first level source includes a forwardly biased MOS transistor with said first threshold level whose voltage drop is substantially same as that of said first MOS transistor;

said second level source includes a forwardly biased MOS transistor with said second threshold level whose voltage drop is substantially same as that of said second MOS transistor; and said third level source includes a forwardly biased MOS transistor with said third threshold level whose voltage drop is substantially same as that of said third MOS transistor.

32. A memory of claim 30, wherein said memory cells include:

a first MOS transistor whose gate threshold voltage corresponds to said first threshold level;

a second MOS transistor whose gate threshold voltage corresponds to said second threshold level;

a third MOS transistor whose gate threshold voltage corresponds to said third threshold level; and a fourth MOS transistor whose gate threshold voltage corresponds to a fourth threshold level of said four predetermined threshold levels;

and wherein said first level source includes:

a first dummy MOS transistor whose gate threshold voltage corresponds to the level between said first and second threshold levels;

a second dummy MOS transistor whose gate threshold voltage corresponds to the level between said second and third threshold levels; and a third dummy MOS transistor whose gate threshold voltage corresponds to the level between said third and fourth threshold levels.

33. A semiconductor IC memory comprising:

a matrix of transistor memory cells storing information represented by the gate threshold voltages of the respective memory cells, each of said memory cells having one of at least three different gate threshold voltage levels representative of three different storable data states;

address circuit means for activating a selected one of said memory cells to produce a read out signal representing the gate threshold voltage of said selected memory cell; and output means including at least two signal comparison circuits receiving said read out signal and generating comparison output signals identifying the gate threshold voltage level of said selected memory cell, said output means producing a digital output representing the data state stored in said selected memory cell, said digital output being generated while said read out signal is in a transient state.

34. The memory set forth in claim 33 wherein each of said memory cells has one of four different gate threshold voltage levels representing four different storage data states.

35. The memory set forth in claim 34 wherein said output means generates a digital output including two binary bits of information representing one of said four different storable data states.

36. The memory set forth in claim 35 wherein said output means further comprises a selection logic circuit receiving said comparison output signals and producing said digital output in response thereto.

* * * * *